US008872598B2

(12) United States Patent
Domingue et al.

(10) Patent No.: US 8,872,598 B2
(45) Date of Patent: Oct. 28, 2014

(54) COMBINER COMPRISING ACOUSTIC TRANSDUCERS

(75) Inventors: Frédéric Domingue, Quebec (CA); Alexandre Reinhardt, Saint Martin d'Heres (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 475 days.

(21) Appl. No.: 13/099,696

(22) Filed: May 3, 2011

(65) Prior Publication Data

US 2011/0273243 A1 Nov. 10, 2011

(30) Foreign Application Priority Data

May 4, 2010 (FR) ..................................... 10 53444

(51) Int. Cl.
| | | |
|---|---|---|
| H03H 7/48 | (2006.01) |
| H01L 41/04 | (2006.01) |
| H01L 41/083 | (2006.01) |
| H03H 9/02 | (2006.01) |
| H03H 9/58 | (2006.01) |
| H03H 9/70 | (2006.01) |
| H03H 9/74 | (2006.01) |

(52) U.S. Cl.
CPC ......... *H03H 9/0222* (2013.01); *H03H 9/02228* (2013.01); *H03H 9/589* (2013.01); *H01L 41/04* (2013.01); *H01L 41/083* (2013.01); *H03H 9/585* (2013.01); *H03H 9/70* (2013.01); *H03H 9/74* (2013.01)
USPC ............................ 333/124; 333/142; 333/100

(58) Field of Classification Search
CPC . H03H 9/0222; H03H 9/02228; H03H 9/585; H03H 9/70; H03H 9/74; H03H 9/589; H03H 9/36; H01L 41/04; H01L 41/083
USPC ......... 333/117, 121, 124, 141, 142, 150, 154, 333/195, 196, 100; 310/313 B, 313 D, 322, 310/323, 328, 334, 335
See application file for complete search history.

(56) References Cited

U.S. PATENT DOCUMENTS 3,836,876 A * 9/1974 Marshall et al. ............... 333/111
4,575,696 A * 3/1986 Hartmann et al. ............. 333/154

(Continued)

FOREIGN PATENT DOCUMENTS

| DE | 102005027457 A1 | 12/2006 |
| JP | 60160719 A | 8/1985 |
| WO | WO 2009/090183 A1 * | 7/2009 |

OTHER PUBLICATIONS

J.G. Wen et al.; "Application of Quad-Phase Surface Acoustic Wave Filters to Power Dividier/Combiner for RF Power Amplifiers"; Proceedings of Asia-Pacific Microwave Conference 2006, Dec. 12-15, 2006, 4 pages.*

(Continued)

*Primary Examiner* — Barbara Summons
(74) *Attorney, Agent, or Firm* — Baker & Hostetler LLP

(57) ABSTRACT

An electrical signal combiner includes at least one first element and a second element respectively connected to a first input port and to a second input port, and a third element connected to an output port, the electrical signals being propagated between the input and output ports. The combiner includes a medium; and the first, second and third elements are acoustic wave transducers, the electrical signals being carried by acoustic waves propagated between the input and output ports within the medium. Advantageously, the first transducer and the third transducer are separated by an acoustic distance of $(2k+1)\lambda/4$ with k an integer greater than or equal to 0 with $\lambda$ the acoustic propagation wavelength; the second transducer and the third transducer are separated by an acoustic distance of $(2k'+1)\lambda/4$ with k' an integer greater than or equal to 0; and the first and second transducers are separated by an acoustic distance of $(2k''+2)\lambda/4$ with k'' an integer greater than or equal to 0—in such a manner as to, on the one hand, generate constructive interference at the output port and, on the other hand, to isolate the first and second input ports by destructive interference of acoustic waves at the ports.

19 Claims, 20 Drawing Sheets

(56) References Cited

U.S. PATENT DOCUMENTS

| | | | |
|---|---|---|---|
| 4,941,133 A * | 7/1990 | Mariani et al. | 367/140 |
| 5,194,830 A * | 3/1993 | Fleischmann | 331/107 A |
| 5,663,696 A * | 9/1997 | Morgan | 333/194 |
| 7,973,620 B2 * | 7/2011 | Shirakawa et al. | 333/189 |
| 2008/0048802 A1 * | 2/2008 | Aigner et al. | 333/189 |
| 2010/0039000 A1 | 2/2010 | Milson et al. | |
| 2010/0277237 A1 * | 11/2010 | Sinha et al. | 330/197 |
| 2010/0301968 A1 * | 12/2010 | Shirakawa et al. | 333/189 |
| 2010/0327995 A1 | 12/2010 | Reinhardt et al. | |
| 2013/0106531 A1 * | 5/2013 | Reinhardt | 333/133 |

OTHER PUBLICATIONS

J.D. Crowley et al.; "Acoustoelectrically Controlled SAW Power Divider"; 1977 IEEE Ultrasonics Symposium Proceedings, 1977, pp. 633-636.*

* cited by examiner

COMBINER COMPRISING ACOUSTIC TRANSDUCERS

CROSS-REFERENCE TO RELATED APPLICATION

This application claims priority to foreign French patent application No. FR 1053444, filed on May 4, 2010, the disclosure of which is incorporated by reference in its entirety.

FIELD OF THE INVENTION

The field of the invention is that of electromechanical devices utilizing the propagation of electrical signals with a view to performing a power combining function, notably for RF power, whilst at the same time maintaining a high isolation between the access ports.

BACKGROUND

Such devices exhibit operating frequencies in the range of a few hundreds of KHz to a few GHz, and are used in wireless transmission systems, for example RF and microwave, in order to combine the power of two signals. For example, advanced amplifier architectures require this type of device in order to combine the amplified signals coming from multiple branches; these can notably be linear amplifiers using non-linear components (LING).

Generally speaking, a combiner is a device allowing two or more separate signals to be combined into a single signal. In the context of wireless systems, this device allows a set of signals to be combined as shown schematically in FIG. 1 in the case of RF signals. Depending on the architecture of the combiner, it is possible to obtain an isolation between the input ports. This isolation limits the influence and the effect of each branch on the other ports. Conventional combiners are made from discrete passive elements or transmission lines.

In the context of mobile wireless communications, such as mobile telephony, the dimensions of the circuits need to be miniaturised. However, the conventional solutions occupy a large volume and are difficult to miniaturise. For example, the solution with discrete components requires components of high values that are difficult to integrate owing to their resulting high losses. On the other hand, the transmission line solution, requires long lines depending on the electrical length. In the ranges of frequencies lower than a few GHz, these physical lengths required are greater than a centimeter and hence difficult to envisage in an integrated circuit.

There is therefore a pressing need to find solutions that can be integrated, in other words that can be miniaturised, in order to enable the development of numerous architectures requiring combinations of power, in particular RF power, for applications of the mobile telephony type and mobile wireless systems.

SUMMARY OF THE INVENTION

For this reason, in this context, the Applicant is proposing a new type of combiner using acoustic components notably exhibiting the advantage of being small, the acoustic length being shorter than the electrical length thus allowing a significant miniaturisation.

Generally speaking, the acoustic components mainly used for filtering utilize the capacity of a piezoelectric material to deform under the application of an electric field. In the presence of an alternating electric signal, acoustic waves are generated in the materials. The major advantage of these acoustic waves comes from their very low propagation speed in comparison to electromagnetic waves. Thus, the acoustic wavelength is very short and enables a considerable miniaturisation given that the wavelength is defined as:

$$\lambda = \frac{V}{f},$$

where $\lambda$ is the wavelength, V the speed of acoustic propagation of the wave and f the frequency. By way of example, for a speed of propagation of around 5000 m/s, the wavelength is 5 µm at a frequency of 1 GHz, which is considerably shorter than for electromagnetic waves. For comparison, for a CPW (coplanar waveguide) line on silicon, the wavelength is 12 cm at 1 GHz.

By converting the electrical signal into an acoustic form, it is possible to process it, to influence it and to utilize the propagated signal. This principle has been widely used in the development of acoustic resonators and RF filters of the "FBAR" (Film Bulk Acoustic Wave), "SMR" (Solidly Mounted Resonator) and "SAW" (Surface Acoustic Wave) type. The first two types of devices use waves referred to as bulk waves, because they propagate within the thickness of a piezoelectric layer. Thus, the cavity into which the wave is input in resonance is simply the piezoelectric layer, sandwiched between two electrodes which allow the electric signal to be applied to the component. Devices such as the "FBAR" or the "SMR" differ in the method used for bounding the resonant cavity: in the first case, an air cavity allows total reflection of the acoustic waves; in the second case, a stack of layers is used which behaves as an acoustic mirror, analogous to the Bragg mirrors used in the field of optics.

As far as the surface acoustic waves or "SAW" devices are concerned, they are fabricated in their simplest form by disposing electrodes in the form of interleaved combs at the surface of a piezoelectric substrate. In any case, the boundary conditions generate a constructive standing wave by confining the acoustic waves in a part of the structure at the resonant frequency. This principle allows compact RF filters to be fabricated with an excellent quality factor. Furthermore, the propagation of the acoustic wave in the materials has been used for the implementation of delay lines.

The use of these acoustic principles may be extended to other RF devices providing an integratable solution with improved performance characteristics.

More precisely, the subject of the present invention is an electrical signal combiner comprising at least one first element and a second element respectively connected to a first input port and to a second input port, and a third element connected to an output port, the electrical signals being propagated between the input and output ports, characterized in that:

the said combiner comprises a medium;
the said first, second and third elements are acoustic wave transducers, the said electrical signals being carried by acoustic waves propagated between the input and output ports within the said medium.

The invention therefore uses the principle of conversion notably of an RF wave or microwave into an acoustic wave in order to utilise the properties of acoustic propagation in the acoustic materials. The acoustic combiner of the invention thus uses an acoustic coupling between guided waves which can either be bulk acoustic waves, or surface acoustic waves, or acoustic Lamb waves or else other types of guided waves (plate waves, generalized Lamb waves, etc.) in an acoustic material, such as for example a piezoelectric material According to one advantageous embodiment of the invention, the acoustic combiner is furthermore capable of maintaining a high isolation between the access ports. The isolation between the access ports makes it possible to ensure a minimum influence of the branches of the combiner on the other ports, thus allowing the fabrication of highly miniaturised acoustic combiners, making it integratable and usable for applications of mobile telephony and mobile systems. It is thus characterized in that:

the first transducer and the third transducer are separated by an acoustic distance of $(2k+1)\lambda/4$ with k an integer greater than or equal to 0 with $\lambda$ the acoustic wavelength of propagation;

the second transducer and the third transducer are separated by an acoustic distance of $(2k'+1)\lambda/4$ with k' an integer greater than or equal to 0;

the first and second transducers are separated by an acoustic distance of $(2k''+2)\lambda/4$ with k'' an integer greater than or equal to 0, in such a manner as to, on the one hand, generate constructive interference at the output port and, on the other, to isolate the said first and second input ports by destructive interference of acoustic waves at the said ports.

According to one variant of the invention, the propagation medium comprises at least one layer of material capable of allowing the propagation of acoustic waves and notably a layer of piezoelectric material.

According to one variant of the invention, the transducers are Lamb-wave transducers.

According to one variant of the invention, the propagation medium comprises a suspended membrane structure in such a manner as to confine the Lamb waves, the said membrane comprising a stack of at least one layer of piezoelectric material and of at least one series of electrodes.

The stack can comprise non-piezoelectric layers, a single series of electrodes (above or below) or a series of electrodes above and below. Furthermore, a series of electrodes can be a single continuous electrode.

According to one variant of the invention, the combiner comprises a Bragg mirror structure and a stack of at least one layer of piezoelectric material and of at least one series of electrodes.

According to one variant of the invention, the combiner comprises a series of subsets of transducers, each subset comprising a first and a second input transducer and an output transducer.

According to one variant of the invention, the first transducers connected to the first port are positioned between two second transducers connected to the second port, in such a manner that, at the first port $P_1$, the waves emitted by two second transducers are 180° out of phase in order to generate destructive interference.

According to one variant of the invention, the combiner comprises between each $i^{th}$ subset respectively comprising a first transducer, an output transducer and a second transducer:

a first, secondary, transducer connected to the first port and positioned at an acoustic distance equal to $\lambda$ from the second transducer belonging to the $i^{th}$ subset, a second, secondary, transducer connected to the second port and positioned at an acoustic distance equal to $\lambda/2$ from the said first secondary transducer and at an acoustic distance equal to $\lambda$ from the first transducer of the $(i+1)^{th}$ subset.

According to one variant of the invention, the combiner comprises at least one first and a second reflector respectively positioned at the beginning and at the end of the assembly of transducers in order to allow the path of the acoustic waves to be folded back.

According to one variant of the invention, the transducers comprise a piezoelectric material with a high piezoelectric coupling coefficient, for example greater than 0.5% and preferably greater than 10%.

According to one variant of the invention, the transducers are bulk acoustic wave transducers and that it comprises a propagation medium in which the input and output transducers are stacked.

According to one variant of the invention, the combiner comprises a structure with three levels of stacked bulk wave resonators comprising:

a first level comprising a lower transducer;

a second level comprising a first intermediate transducer connected to a first input port and a second intermediate transducer connected to a second port, the said intermediate transducers being separated from the lower transducer by a first intermediate layer;

a third level comprising an upper transducer connected to an output port (Ps), separated from the intermediate transducers by a second intermediate layer;

the thicknesses of the upper transducer and of the second intermediate layer make a total of $(2k+1)\lambda/4$ with k an integer greater than or equal to 0;

the thicknesses of the intermediate transducers and of the first intermediate layer make a total of $(2k'+2)\lambda/4$ with k' an integer greater than or equal to 0.

According to one variant of the invention, the transducers comprise a piezoelectric layer of AlN, the intermediate layers being composed of $SiO_2$.

For Lamb or bulk acoustic waves, the piezoelectric material chosen is advantageously AlN, nevertheless the piezoelectric material may also be $LiNBO_3$ or $LiTaO_3$ or, alternatively, BST, STO, PZT, etc. As regards the intermediate layers, these can be composed of piezoelectric material or $SiO_2$ or SiN or metal.

According to one variant of the invention, the combiner is an RF combiner.

BRIEF LIST OF THE DRAWINGS

The invention will be better understood and other advantages will become apparent upon reading the description that follows and by virtue of the appended figures, in which.

DETAILED DESCRIPTION

The invention is hereinafter described for a combiner of the RF type, it being well understood that the invention may be applied to other types of frequencies.

Typically, the acoustic combiner of the invention can be based on acoustic coupling between guided waves in a piezoelectric material: either bulk waves, or Lamb waves, or else other types of guided waves in a piezoelectric layer (plate waves, generalized Lamb waves, etc.).

The structure of the combiner comprises at least three transducers (devices allowing the generation of acoustic waves in a medium referred to as acoustic medium M, starting from an electrical signal, or vice-versa), a first transducer $T_1$ connected to a first input port $P_{1e}$, a second transducer $T_2$ connected to a second electrical input port $P_{2e}$ and a third transducer Ts connected to an electrical output port $P_s$.

Figure 1:
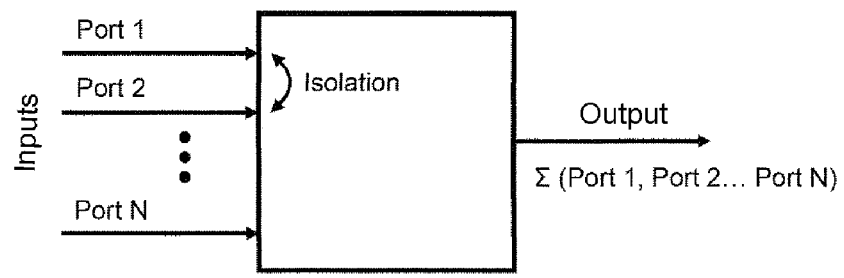
FIG. 1 illustrates the circuit diagram of a combiner for RF signals.
Figure 2:
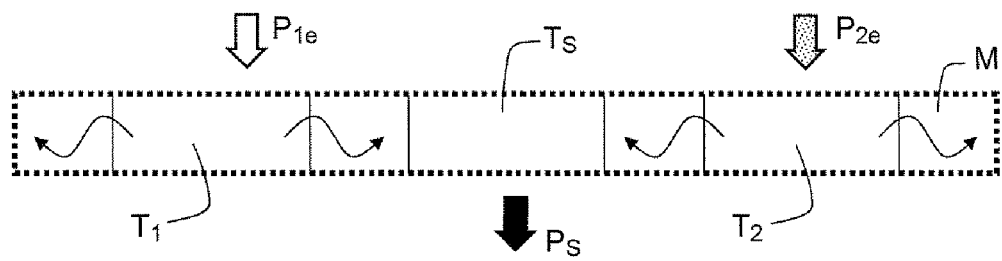
FIG. 2 illustrates an acoustic RF combiner according to the invention.

The main purpose of the transducers corresponding to the ports $P_{1e}$, $P_{2e}$ is to generate waves carrying the electrical signal. These waves interact constructively in the transducer corresponding to the output port, as shown in FIG. 2.

In order to optimize the combiner structures previously described, it can be particularly advantageous to improve the isolation between the input ports if the transducers connected to input ports are not located in any particular position.

Figure 3:
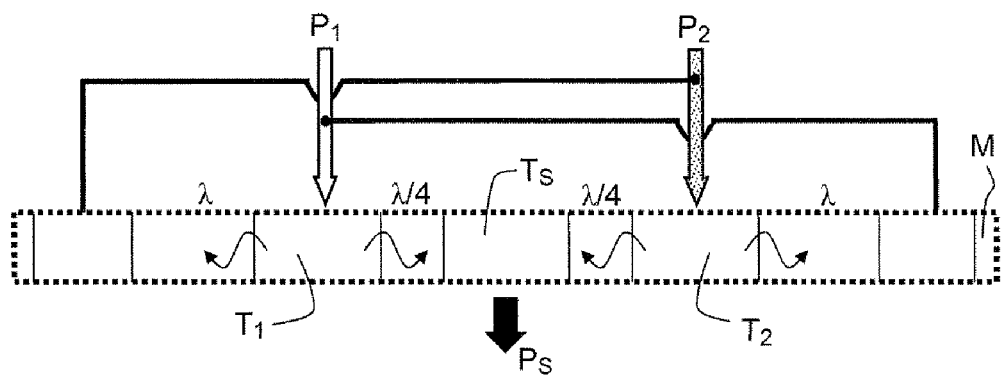
FIG. 3 illustrates one variant of acoustic RF combiner according to the invention.

According to one variant of the invention, the RF combiner comprises input and output surface-wave transducers allowing RF signal powers to be combined at the output. For this reason and according to the present invention, an isolation of the input ports from one another is introduced as illustrated in FIG. 3. Thus, the RF combiner comprises a first transducer $T_1$ connected to a first input port $P_1$ and a second transducer $T_2$ connected to a second input port $P_2$ and a third transducer $T_s$ connected to a third output port $P_s$, the first transducer being separated from the third transducer by a distance equal to $\lambda/4$, just as the second transducer is separated from the third transducer by a distance equal to $\lambda/4$.

Thus, the basic structure provided relies on an isolation of the ports that is produced by destructive interference of the signals propagated between the various input ports in an acoustic line. For this purpose, the fact that each transducer always emits waves in two opposing directions is exploited. The transducers of one port, for example 1, are thus placed between two transducers of another port, for example 2, situated in such a manner that, at the port $P_1$, the waves emitted by the two transducers of the port $P_2$ are 180° out of phase, which thus generates destructive interference. Conversely, the output transducer is placed between transducers of the ports $P_1$ and $P_2$ at a position where the phase differences of the waves emitted by each of these ports are equal, which thus generates constructive interference at the output.

Figure 4:
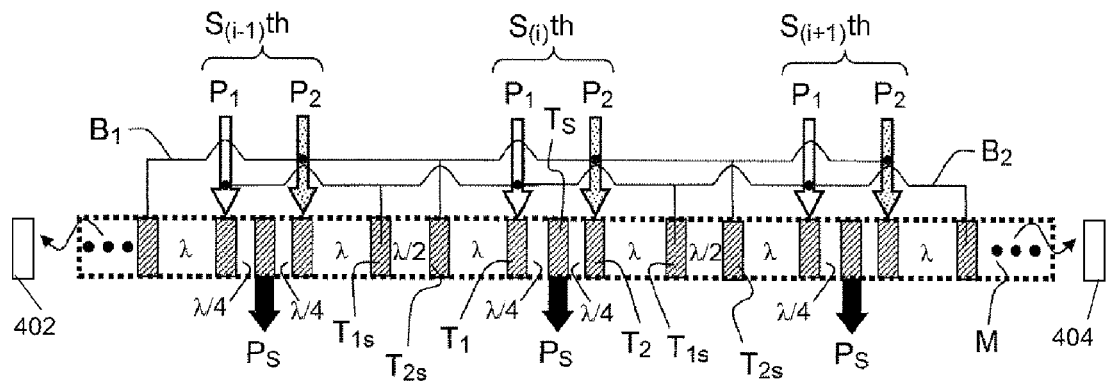
FIG. 4 illustrates one variant generalizing the transducer structure illustrated in FIG. 3.

Advantageously, the waves used can be made to travel in a periodic repetition of the basic invention proposed. Buses $B_1$ and $B_2$ provide the interconnections between all the ports $P_1$ and all the ports $P_2$. This can be obtained by physically repeating the basic structure, as shown in FIG. 4, and/or by folding back the path of the waves using suitable reflectors (e.g., at least one first reflector 402 and at least one second reflector 404, respectively positioned at the beginning and at the end of the set of transducers $S_i$). In this way, the losses produced by the electro-acoustic conversion are reduced. Moreover, the leakage of energy by generation of waves capable of escaping the array of transducers is thus avoided. The period of the basic cell is fixed in such a manner as to preserve the phase of the signal and to recover the maximum power.

More precisely, FIG. 4 highlights a series of subsets $S_{i-1}$, $S_i$ and $S_{i+1}$. Each subset comprises between each $i^{th}$ subset respectively comprising a first transducer $T_1$, an output transducer $T_s$ and a second transducer $T_2$:
 a first, secondary, transducer $T_{1s}$ connected to the first port and positioned at an acoustic distance equal to $\lambda$ from the second transducer belonging to the $i^{th}$ subset,
 a second, secondary, transducer $T_{2s}$ connected to the second port and positioned at an acoustic distance equal to $\lambda/2$ from the said first secondary transducer and at an acoustic distance equal to $\lambda$ from the first transducer of the $(i+1)^{th}$ subset.

It should be noted that the choice of the piezoelectric material greatly influences the level of the insertion losses. The electromechanical coupling coefficient directly affects the transmission possible. It is therefore possible to minimize the number of periods needed by using material with a high piezoelectric coupling coefficient.

Exemplary Embodiment of an RF Combiner Comprising Lamb-Wave Transducers within a Suspended Membrane Component.

According to this example, the RF combiner uses the propagation of Lamb waves, which correspond to waves propagating in a plate, and confined in this plate due to their reflection at the solid/air interfaces.

More precisely, the combiner comprises a plate of piezoelectric material in which Lamb waves are propagated. This material can be of the AlN type, the thickness of this layer being 2000 nm. The lower electrodes are defined in a layer of molybdenum of 200 nm thickness, the upper electrodes being defined in an AlSi layer also of 200 nm thickness. All of the transducers are covered with a protection layer of 500 nm of $SiO_2$.

In such a stack, the Lamb waves propagate at a speed of 7800 m/s in the presence of the upper metallization and 8400 m/s in the absence of an upper electrode. These speeds may be calculated by various methods described in the literature: by finite elements or by numerical methods such as for example the scattering matrix method, as described notably in the articles: A. Reinhardt, V. Laude, M. Solal, S. Ballandras and W. Steiche, *Investigation of spurious resonances in Thin Film Bulk Acoustic Wave Resonators*, Proceedings of the 2004 IEEE Ultrasonics Symposium and S. Ballandras, V. Laude, *Simulation of transverse effects in FBAR devices,* 2005 IEEE MTT6S Digest.

The structure of the combiner thus comprises three series of electrode combs, respectively connected to a first input port, to a second input port and to an output port. The electrodes of the combs are commonly called fingers. In addition, each comb comprises lower and upper fingers or electrodes.

The most compact structure of a combiner with isolation of the input ports corresponds to a structure with 4 fingers per wavelength (in such a manner as to have a quarter wavelength from finger centre to finger centre), even if not all the fingers are presents as is illustrated in FIGS. 3 and 4.

The width of the combs is equal to ⅛ of the wavelength of the wave under the combs, or approximately 300 nm at a frequency of 3.5 GHz.

The distance between the combs is variable as a function of the position within the array of combs in order to define the series of three transducers.

Within a subset comprising two transducers, referred to as input transducers, $T_1$ and $T_2$ and an output transducer Ts, the distance b between a first comb finger and an output comb finger is equal to 300 nm, the combs being separated by a quarter wavelength.

Between a first comb finger corresponding to a secondary transducer $T_{1s}$ and second comb finger corresponding to a secondary transducer $T_{2s}$, the distance c is equal to 900 nm, the combs being separated by half a wavelength.

Between a first comb finger corresponding to a secondary transducer $T_{1s}$ and a second comb finger corresponding to a transducer $T_{2s}$, the distance d is equal to 2.1 μm, the combs being separated by one wavelength It is of course possible to vary the distances between combs, as long as the phase difference remains constant, modulo 2π.

The performance characteristics of a combiner with isolation of the input ports have been compared with those of an RF combiner without isolation of the input ports.

Figure 5:
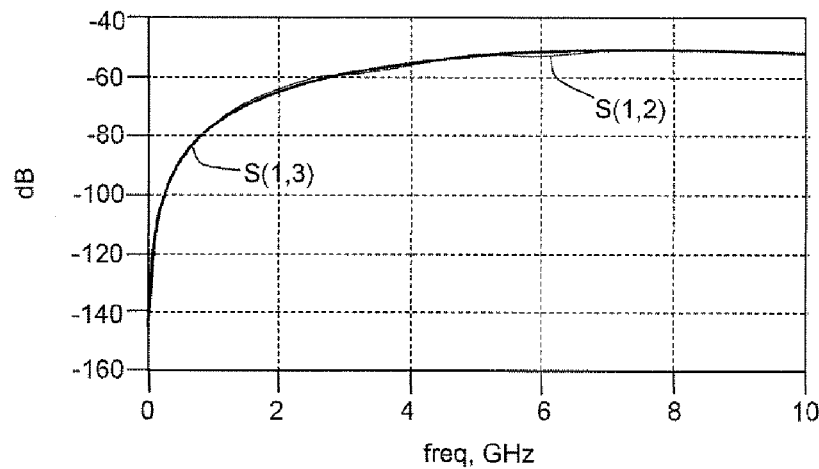
FIG. 5 illustrates the frequency response of a conventional combiner without isolation of the input ports such as is shown in FIG. 2.

For an RF combiner structure in which the input ports are not isolated, FIG. 5 shows the calculated response for the configuration shown in FIG. 2. The losses are high in such a structure because there is no confinement of the acoustic waves emitted at the input ports. The absence of isolation between the ports $P_1$ and $P_2$ is also noted. The curves S(1,2) and S(1, 3) respectively corresponding to the transmission of the signal from the port 1 to the port 2 and the port 3 are almost the same.

Figure 6:
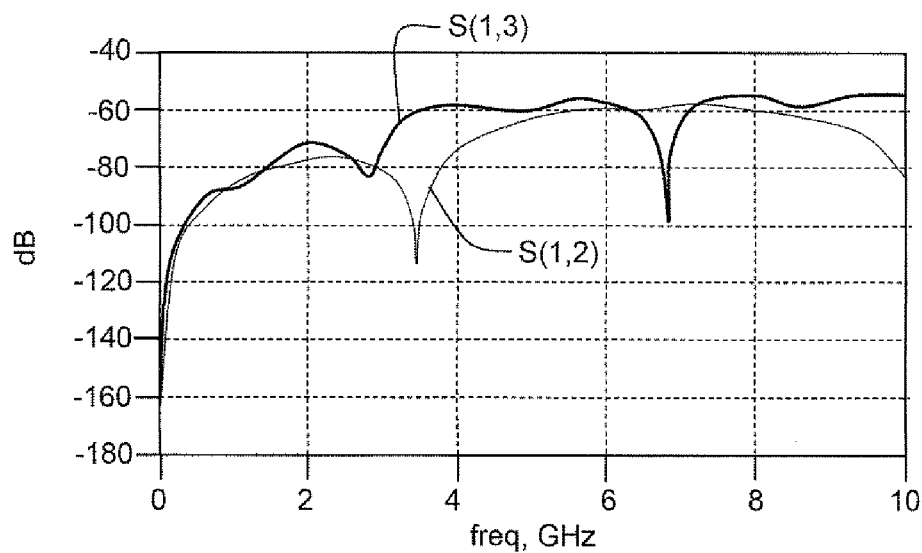
FIG. 6 illustrates the frequency response of the isolated combiner for an elementary cell, within a combiner of the invention such as is shown in FIG. 3.

FIG. 6 presents the result for a combiner elementary cell with isolated ports, according to the present invention. This figure shows the relevance of the invention detailed here in providing a high isolation between the channels.

Figure 7:
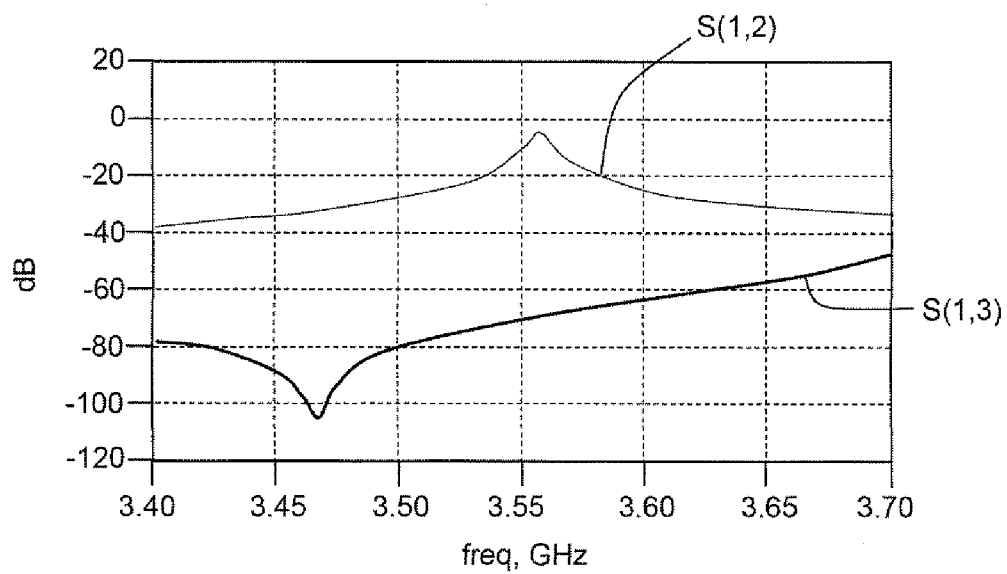
FIG. 7 illustrates the performance characteristics with a series of subsets of three transducers, within a combiner according to the invention.

The results in FIG. 7 show the advantage of the periodic combination, such as is illustrated in FIG. 4, of several elementary cells in order to reduce the insertion losses. By increasing the number of cells, it is possible to minimize the insertion losses considerably.

One embodiment of such an RF combiner comprising Lamb-wave transducers with its network of interconnections will hereinafter be described in more detail.

Figure 8:
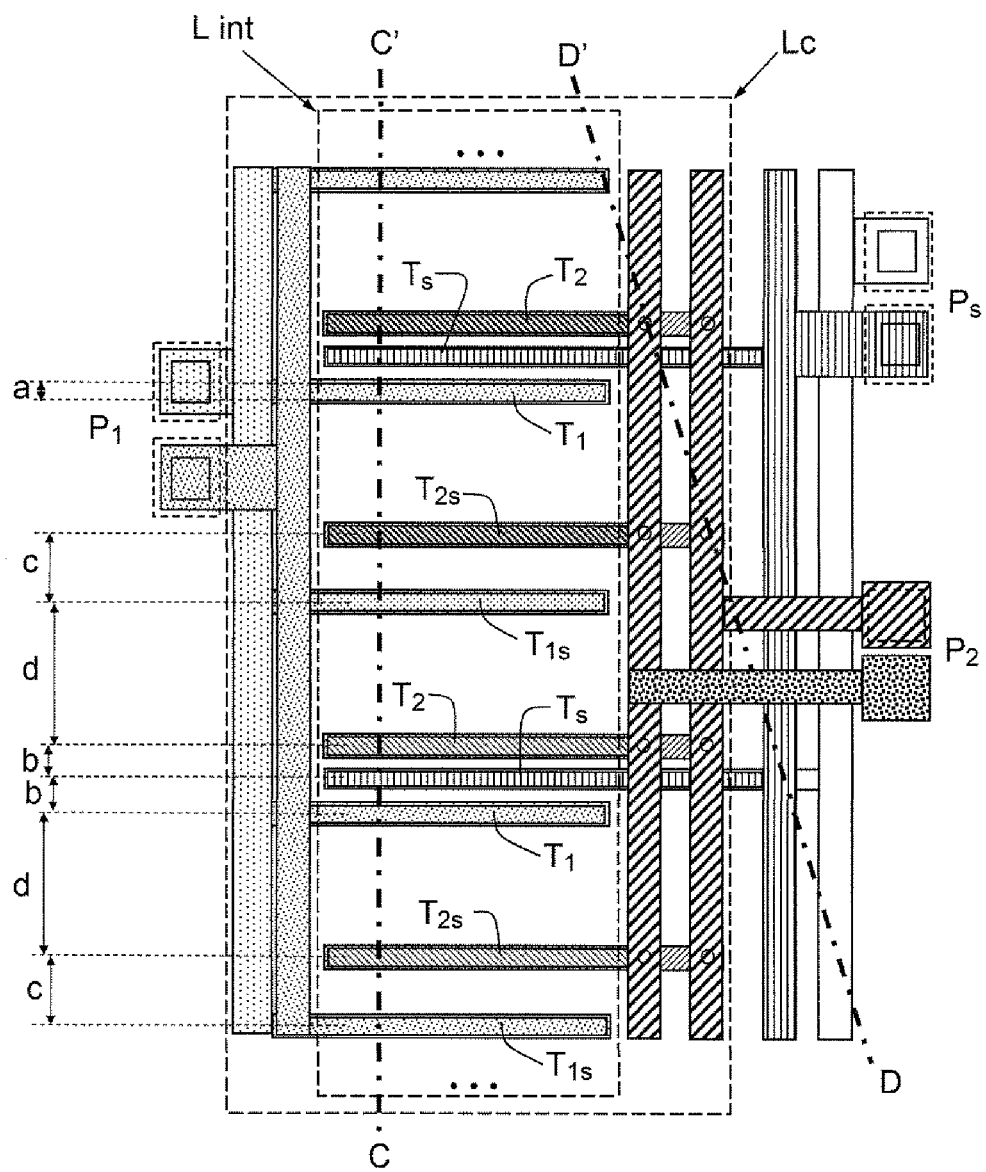
FIG. 8 is a schematic view of an acoustic combiner utilizing Lamb waves according to the invention.

The structure of the combiner comprises three series of electrode combs respectively connected to an element of input port $P_1$, to a second input port $P_2$ and to an output port $P_S$, each comb comprising lower electrodes and upper electrodes as illustrated in FIG. 8. Two frames, shown as dashed lines, define, on the one hand, the limits Lc of the cavity under the suspended membrane allowing the propagation of Lamb waves and, on the other hand, the limits of the openings of the insulating material of the interconnections $L_{int}$.

The three ports are represented by different patterns.

Figure 9A:
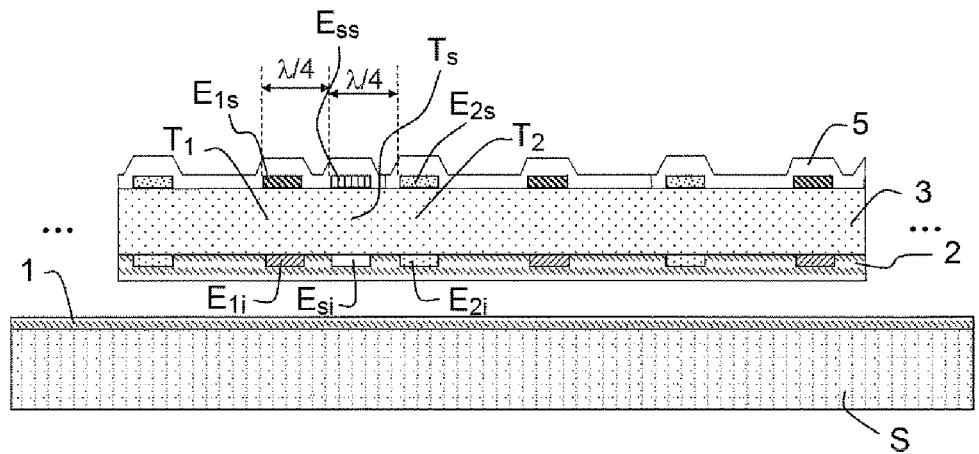
FIGS. 9a and 9b illustrate cross-sectional views of an example of RF combiner according to the invention, comprising Lamb-wave devices on the surface of a membrane.
Figure 9B:
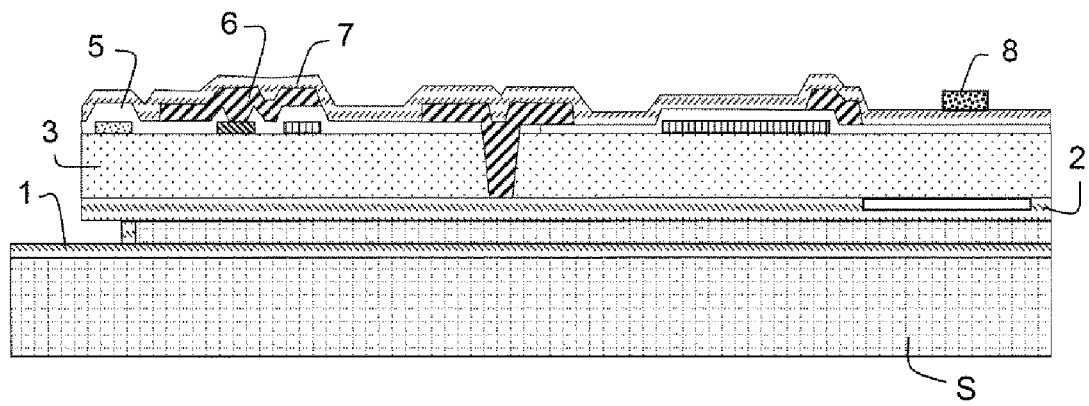

FIGS. 9a and 9b show two cross-sectional views of the component: one along a cross-section C-C' showing a section of the active portion of the combiner, and the other being a cross-sectional view along an axis D-D' showing the organization of the interconnections.

The dimensions and spacings between combs are calculated as indicated in the section "Numerical examples".

More precisely, the component comprises a membrane suspended above a substrate S, comprising a layer of oxide 1. The suspended membrane comprises a layer of piezoelectric material 3, on either side of which are formed electrodes connected to the ports $P_1$, $P_2$ and $P_s$, lower electrodes $E_{1i}$, $E_{si}$ and $E_{2i}$ and upper electrodes $E_{1s}$, $E_{ss}$ and $E_{2s}$. The electrodes $E_{1i}$ and $E_{1s}$ define the first input resonator connected to the first input port, the electrodes $E_{2i}$ and $E_{2s}$ define the second input resonator connected to the second input port, the electrodes $E_{si}$ and $E_{ss}$ defining the resonator connected to the output port.

The two input resonators are separated by an acoustic distance of λ/2, each input resonator being separated from the output resonator by an acoustic distance of λ/4.

An insulating layer 5 is deposited on the surface of the set of upper electrodes.

Interconnection layers 6 and 8 allow the required contact layers to be formed and are isolated from one another by an insulating layer 7.

FIGS. 10a to 10k illustrate the various steps in the fabrication of such an RF combiner.

Figure 10A:
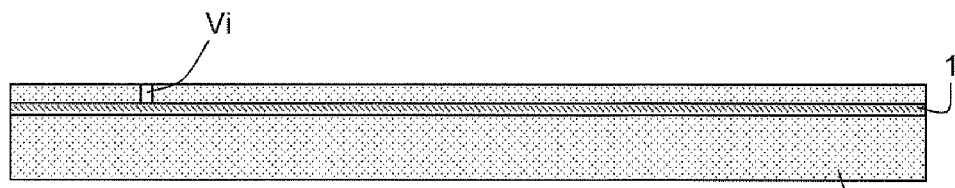
FIGS. 10a to 10k illustrate the various steps in a method for fabricating a Lamb-wave RF combiner comprising a suspended membrane such as that shown in FIGS. 9a and 9b.

According to a first step illustrated in FIG. 10a, starting from an SOI (Silicon On Insulator) substrate S, trenches Vi are formed, the SOI substrate being a silicon substrate with an integrated layer of $SiO_2$ 1 and fabricated according to known techniques.

Figure 10B:
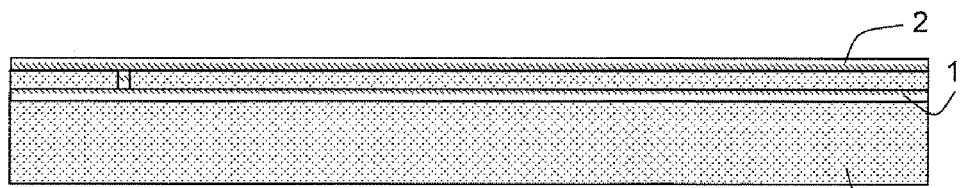

According to a second step illustrated in FIG. 10b, a thermal oxidation process is applied so as to define an upper layer and wells composed of silicon dioxide $SiO_2$, thus resulting in the presence of two oxide layers 1 and 2.

Figure 10C:
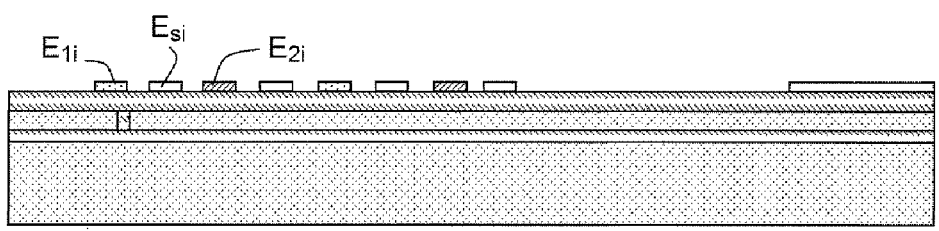

According to a third step illustrated in FIG. 10c, the lower electrodes $E_{1i}$, $E_{2i}$ and $E_{si}$ made of molybdenum are deposited and structured, corresponding to a first connection level.

Figure 10D:
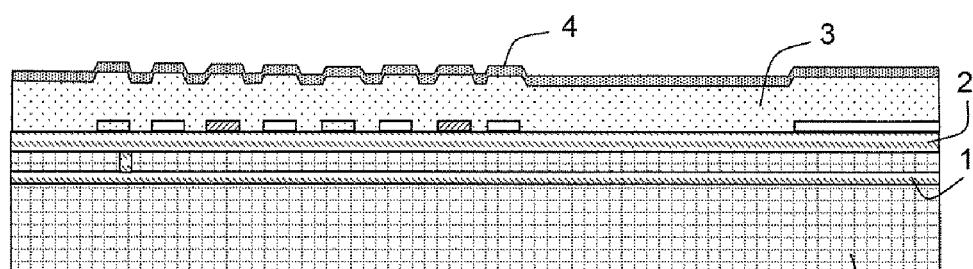

According to a fourth step illustrated in FIG. 10d, the layer of piezoelectric material 3 composed of AlN is deposited and an upper layer 4 made of molybdenum is deposited.

Figure 10E:
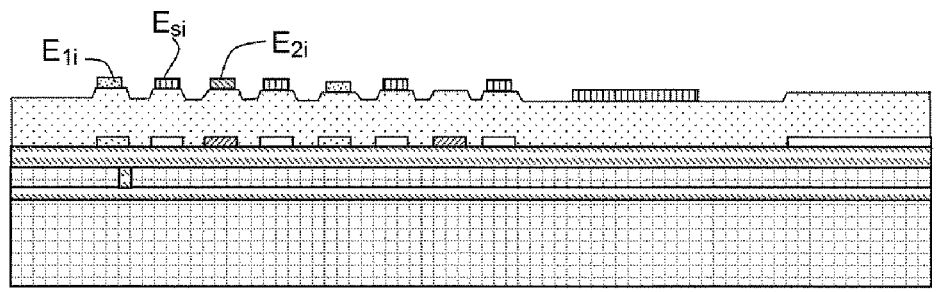

According to a fifth step illustrated in FIG. 10e, structuring of the layer 4, the upper electrodes $E_{1s}$, $E_{2s}$, $E_{ss}$, and thus the second connection level, is carried out by fluorine-based dry etching.

Figure 10F:
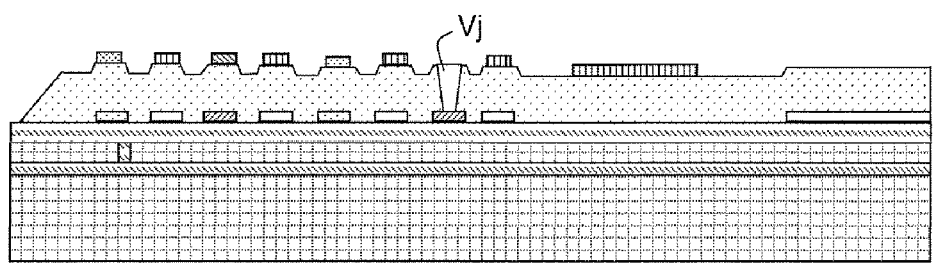

According to a sixth step illustrated in FIG. 10f, the AlN material is etched by $H_3PO_4$ wet etching, in order to form vias Vj.

Figure 10G:
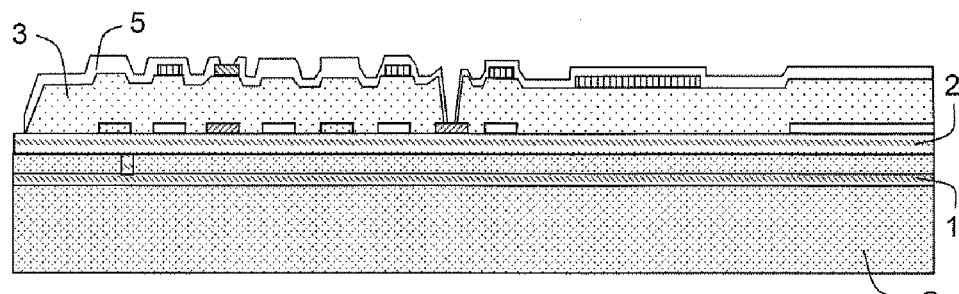

According to a seventh step illustrated in FIG. 10g, a layer 5 of SiN designed to protect the layer of piezoelectric material is deposited, followed by the opening of contacts using fluorine-based dry etching.

Figure 10H:
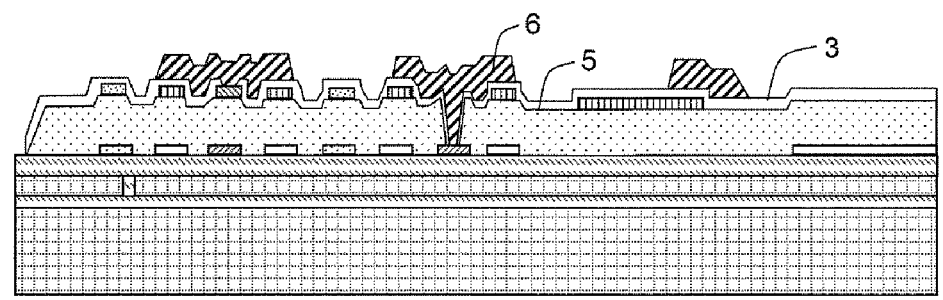

According to an eighth step illustrated in FIG. 10h, a layer of aluminium 6 is deposited, which is etched by $H_3PO_4$ wet etching, enabling the third connection level to be defined.

Figure 10I:
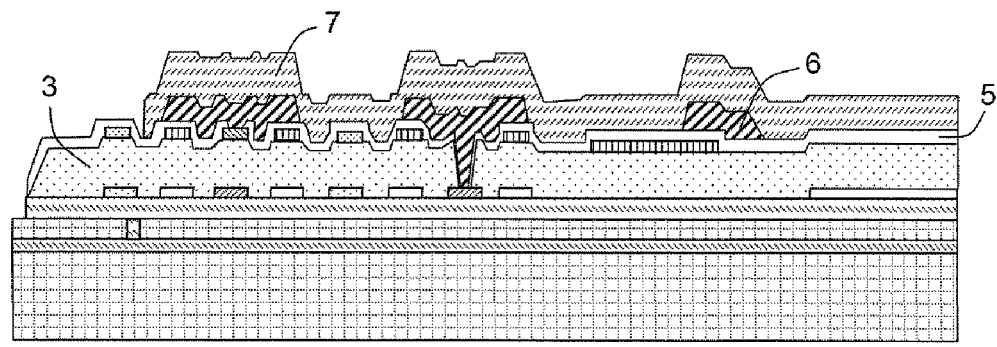

According to a ninth step illustrated in FIG. 10i, a layer 7 of $SiO_2$, is deposited, followed by a wet etching step using HF, for example in order to define interconnections.

Figure 10J:
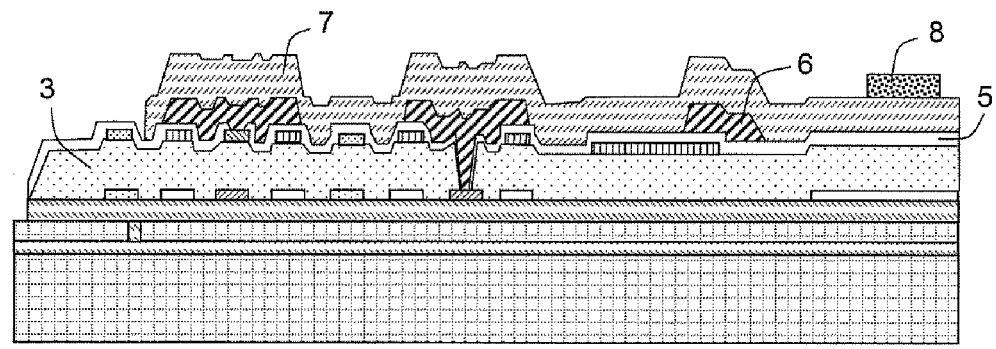

According to a tenth step illustrated in FIG. 10j, a layer of aluminium 8 is deposited, its structuring allowing the fourth connection level to be defined.

Figure 10K:
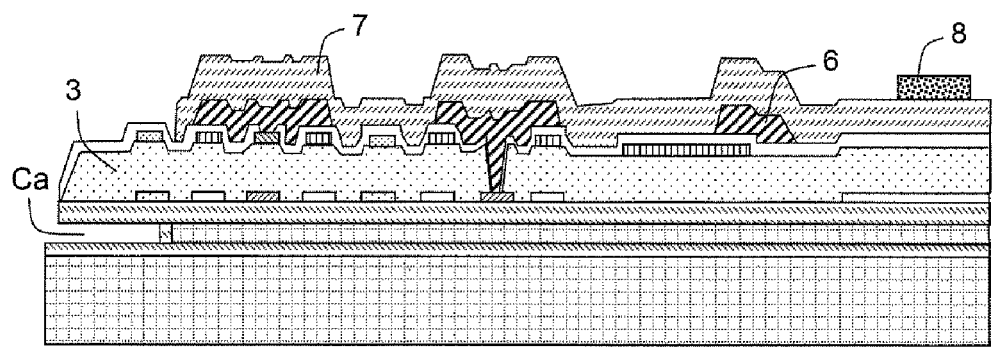

According to an eleventh step illustrated in FIG. 10k, the membrane is released by etching of the silicon with $XeF_2$ gas, allowing Lamb-wave acoustic devices to be formed with a cavity Ca releasing the suspended membrane.

A step for frequency adjustment of the component by localized etching of the layer of SiN protecting the active portion may be envisaged. For this purpose, for example an item of etching equipment using an atom cluster beam is employed, for example using $NF_3$.

Exemplary Embodiment of an RF Combiner Comprising Lamb-Wave Transducers within a Component Comprising a Bragg Mirror Structure.

The acoustic RF combiner is thus based on the use of guided waves in a piezoelectric layer confined by the use of a Bragg mirror structure. Such waves are at first sight similar to the Lamb waves discussed previously.

The design of such a structure is therefore carried out in the same way: calculation of the speed of the waves used in the metallized and non-metallized sections by methods similar to those used for the Lamb waves, then design of the interleaved comb patterns according to the same method.

For such a component, the representation in FIG. 8 remains identical, aside from the elimination of the limits of the cavity formed under the combiner.

Figure 11A:
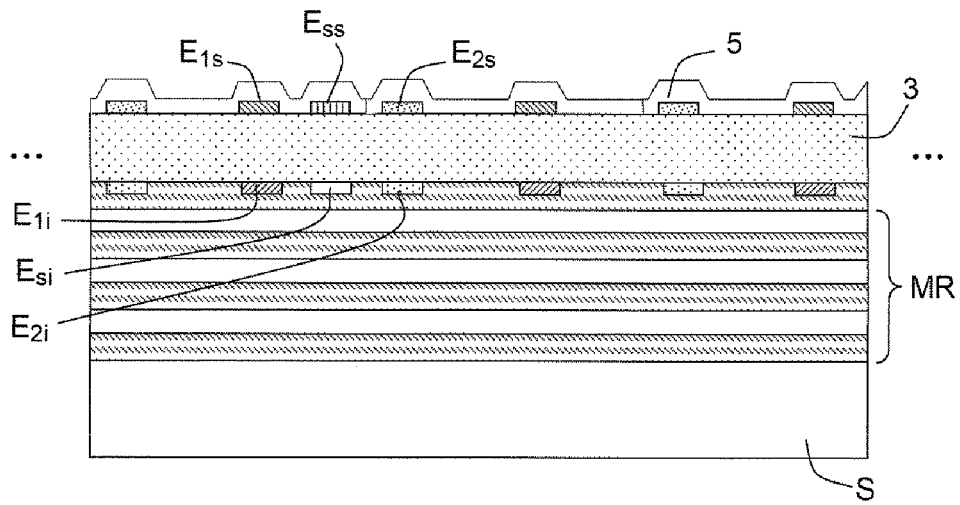
FIGS. 11a and 11b illustrate views of an RF combiner according to the invention comprising devices using Lamb waves confined by a Bragg mirror structure.
Figure 11B:
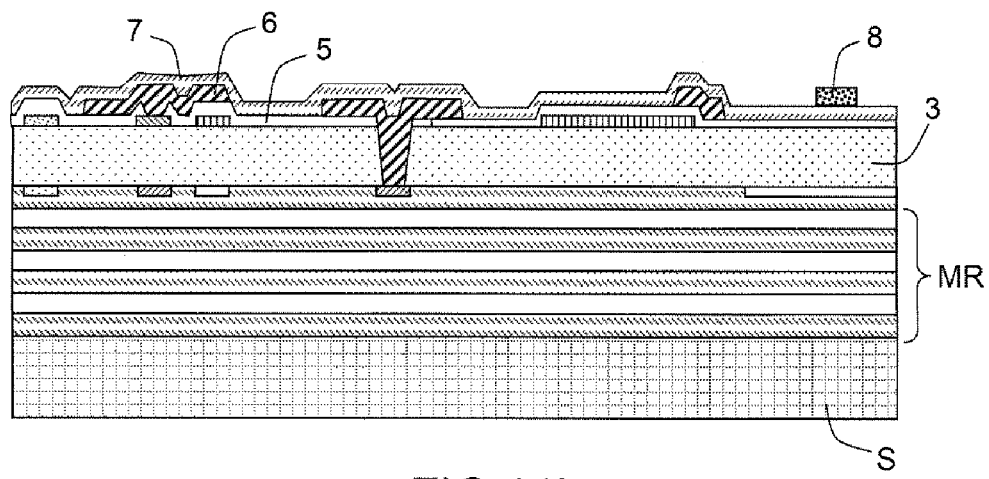

FIGS. 11a and 11b show cross-sectional views along the axis C-C' and along the axis D-OF. The structure of the piezoelectric layer 3 and of the electrodes allowing all of the transducers to be formed is confined to the surface of a Bragg mirror structure MR composed of a stack of layers. The layers 5, 6, 7 and 8 correspond to those described with reference to FIGS. 9a and 9b.

One exemplary method of fabrication is illustrated by FIGS. 12a to 12i.

Figure 12A:
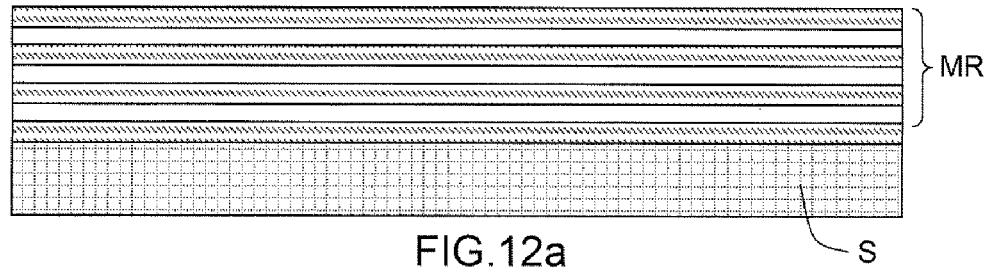
FIGS. 12a to 12i illustrate the various steps in a method fabricating the combiner such as is shown in FIGS. 11a and 11b.

According to a first step of the method illustrated in FIG. 12a, a Bragg mirror is formed by successive depositions of layers of SiN and of SiOC, composing the Bragg mirror MR on a high resistivity silicon substrate.

Figure 12B:
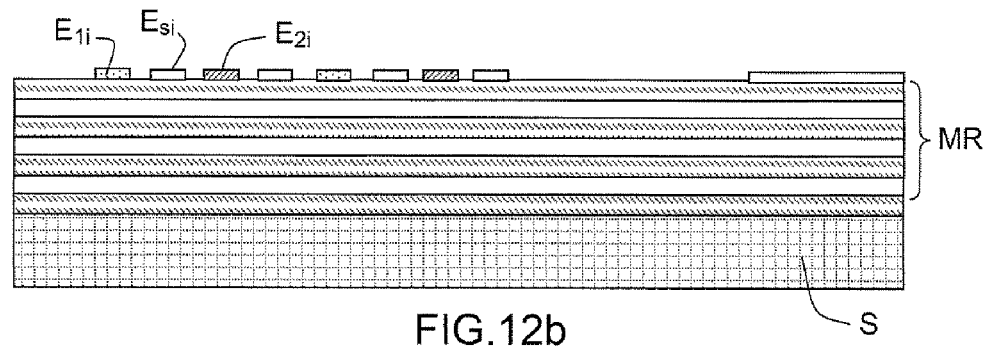

According to a second step illustrated in FIG. 12b, the deposition is carried out followed by the structuring of the lower electrodes, $E_{1i}$, $E_{2i}$ and $E_{si}$, made of molybdenum thus defining the first connection level.

Figure 12C:
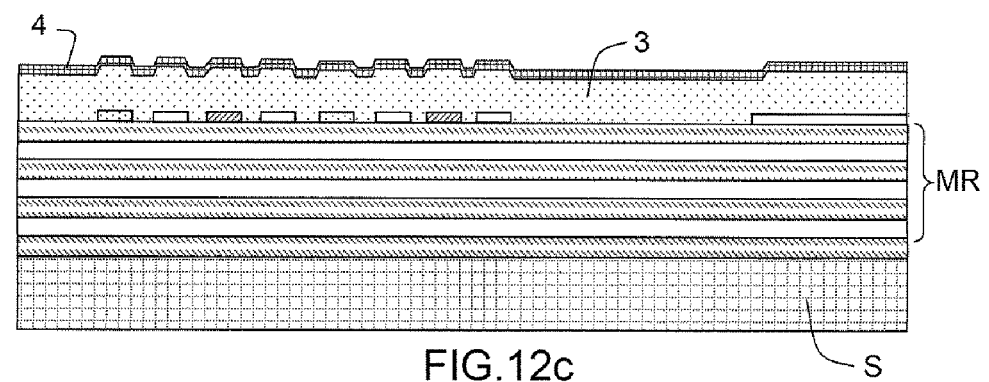

According to a third step illustrated in FIG. 12c, a layer 3 of piezoelectric material composed of AlN is deposited with deposition of an upper layer 4 of molybdenum for the formation of the upper electrodes.

Figure 12D:
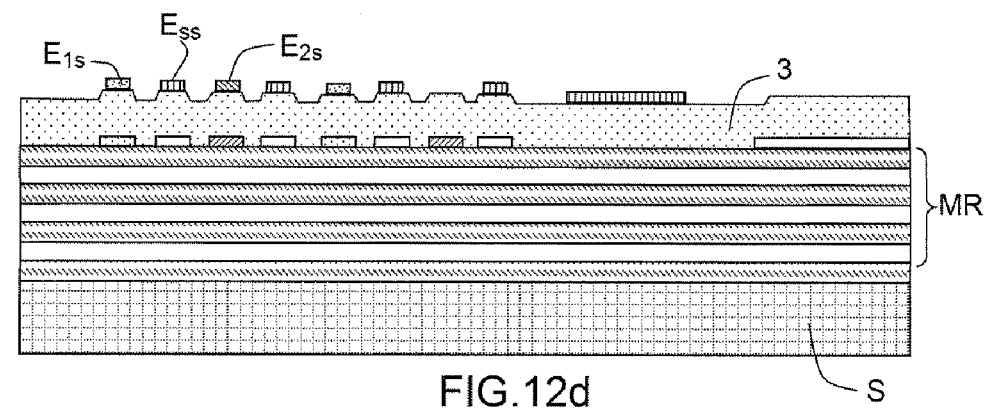

According to a fourth step illustrated in FIG. 12d, the structuring of the said layer is carried out in order to form the upper electrodes $E_{1s}$, $E_{2s}$, $E_{ss}$ by fluorine-based dry etching.

Figure 12E:
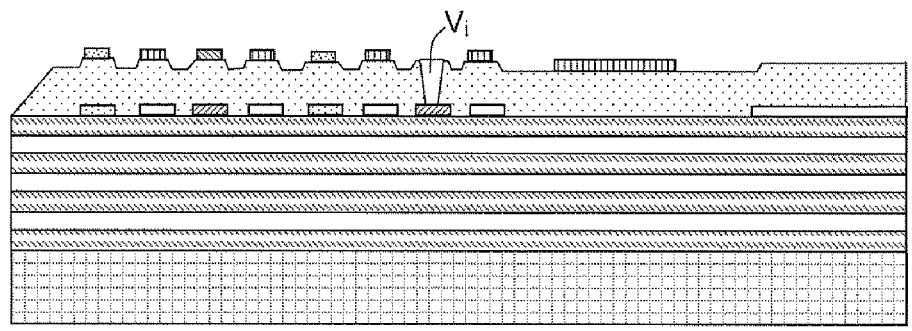

According to a fifth step illustrated in FIG. 12e, the etching of the layer of piezoelectric AlN material is carried out by wet etching with $H_3PO_4$ allowing the via Vi to be obtained.

Figure 12F:
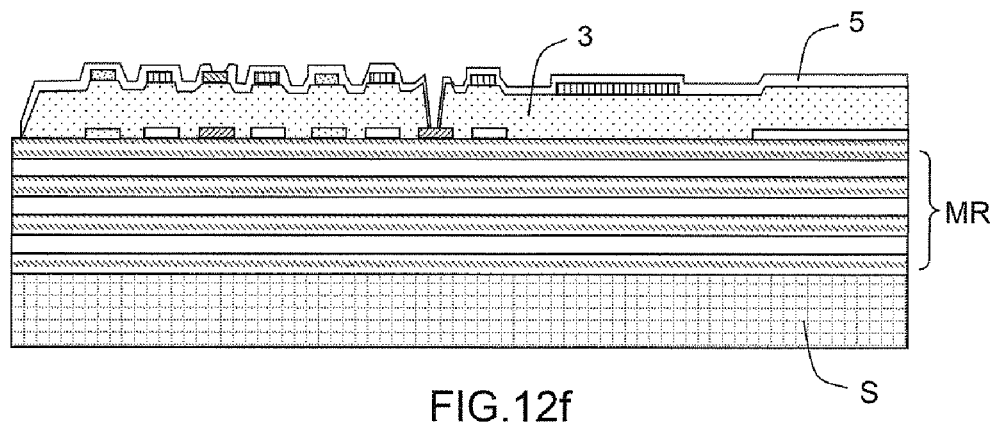

According to a sixth step illustrated in FIG. 12f, the deposition of a layer 5 of SiN then the opening of contacts by fluorine-based dry etching are carried out.

Figure 12G:
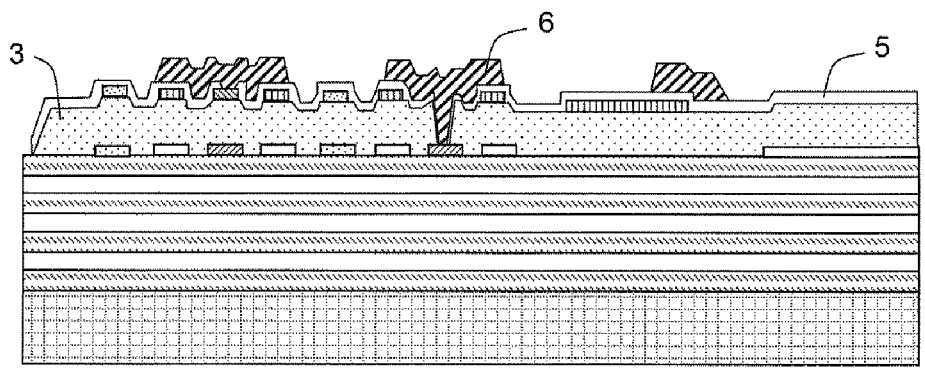

According to a seventh step illustrated in FIG. 12g, a layer 6 of aluminium is deposited and is then etched by $H_3PO_4$ wet etching, allowing the third connection level to be defined.

Figure 12H:
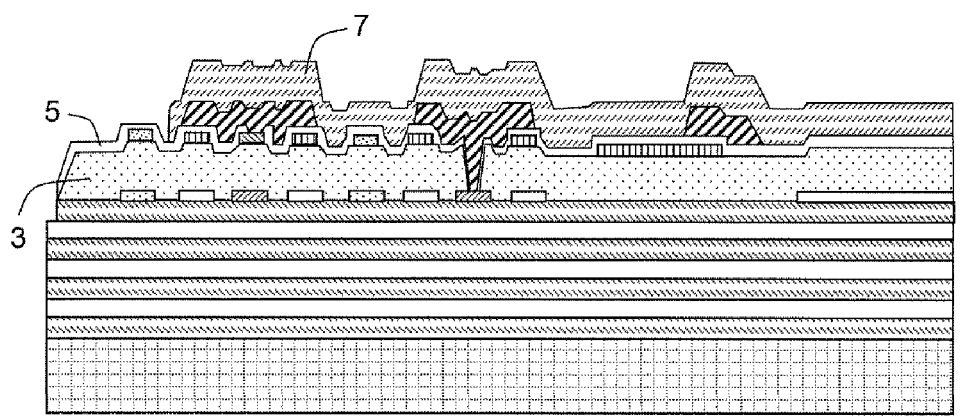

According to an eighth step illustrated in FIG. 12h, a layer 7 of $SiO_2$ is deposited followed by a step for wet etching by HF for example, in order to define interconnections.

Figure 12I:
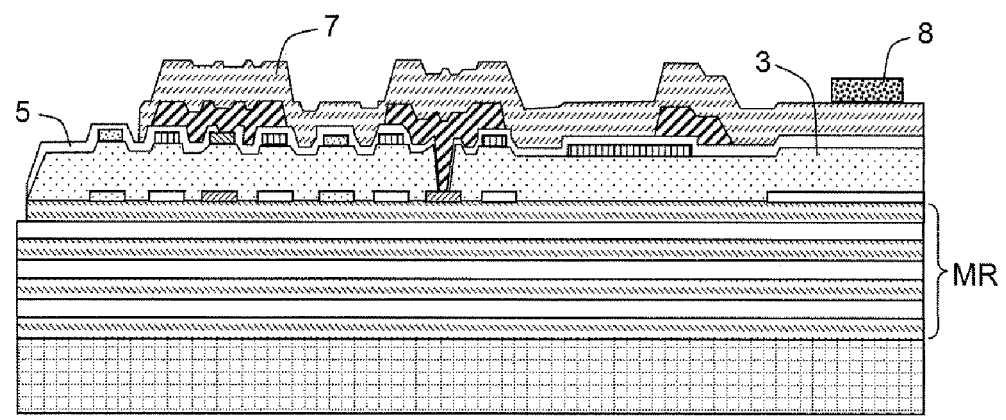

According to a ninth step illustrated in FIG. 12i, a layer 8 of aluminium is deposited whose structuring allows the fourth connection level to be defined.

A step for frequency adjustment of the component by localized etching of the layer of SiN protecting the active portion may be envisaged. For this purpose, for example an item of etching equipment using an atom cluster beam is employed, for example using $NF_3$.

Exemplary Embodiment of an RF Combiner Comprising Bulk Wave Transducers.

In this example, the acoustic RF combiner utilizes bulk acoustic waves. For this purpose, waves propagating vertically within the stack of layers are used. Instead of exciting the waves using interleaved combs, metal/piezoelectric/metal stacks are used, similar to standard BAW resonators. Their thickness is not however more than half a wavelength as is usually the case for conventional BAW resonators.

On the other hand, in order not to over-complicate the fabrication method, all the resonators are not placed one on top of the other (aligned in the direction of propagation), but a technique is employed for "folding back" the path of the signal propagating in the structure in an electrical and in an acoustic form simultaneously.

Figure 13A:
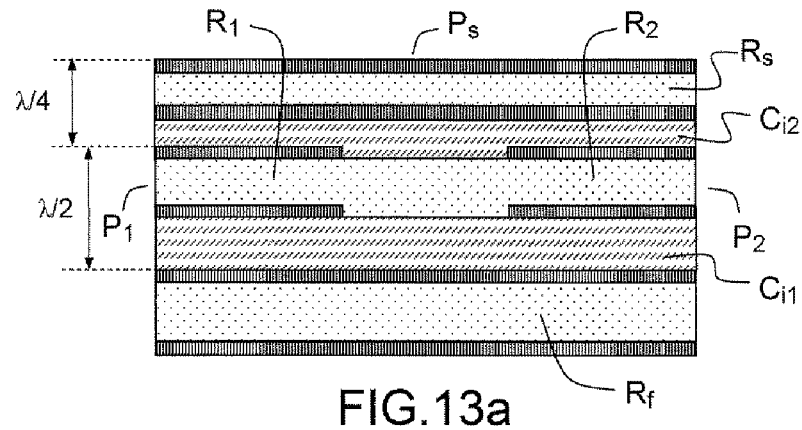
FIGS. 13a, 13b and 13c show, respectively, resonators and associated ports, the propagation of the signal from the port $P_1$ to the output port Ps, and the propagation of the signal from the port $P_1$ to the port $P_2$, within an acoustic combiner using bulk waves according to the invention.
Figure 13B:
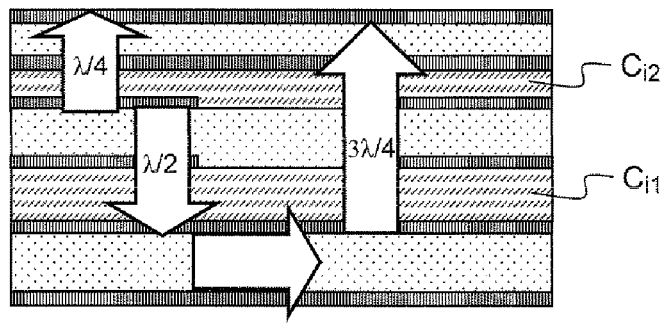
Figure 13C:
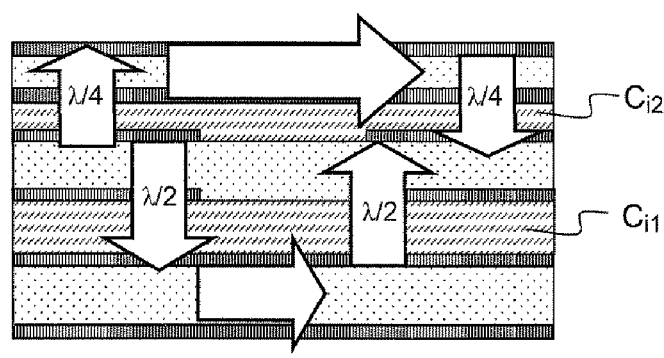

A schematic representation is illustrated by FIGS. 13a, 13b and 13c. Two sections are used each composed of 3 levels of stacked resonators, between which are inserted one or more layers, referred to as intermediate layers, whose purpose is to provide the acoustic waves with a phase-shift during its propagation through the structure.

More precisely, the following are defined: a lower resonator, referred to as floating resonator by reason of its electrodes which are at a floating potential, two resonators $R_1$ and $R_2$ at the intermediate level, respectively connected to a first input port $P_1$ and to a second input port $P_2$, and a resonator $R_s$ referred to as output resonator.

The resonators $R_1$ and $R_2$ are coupled to a first intermediate layer $C_{i1}$ and the output resonator is coupled to a second intermediate layer $C_{i2}$.

The arrows illustrate the propagation of the bulk acoustic waves within such a structure and indicate schematically the paths output directly from an input port and output from an opposing port.

Thus, the thicknesses of the upper output resonator and of the first intermediate layer are calculated in such a manner as to provide a phase-shift of $\pi/2$ when traversed by the wave. As for the thicknesses of the input resonators and of the second intermediate layer, these are calculated in order to provide a phase-shift of $\pi$ when they are traversed. The two electrodes of the upper resonator are connected to the output port of the component and extend over the two sections at the same time.

The ports $P_1$ and $P_2$ are each connected to the electrodes of the intermediate resonators. As regards the lower resonator, this also extends over the two sections at the same time, but its electrodes are left floating.

Figure 14A:
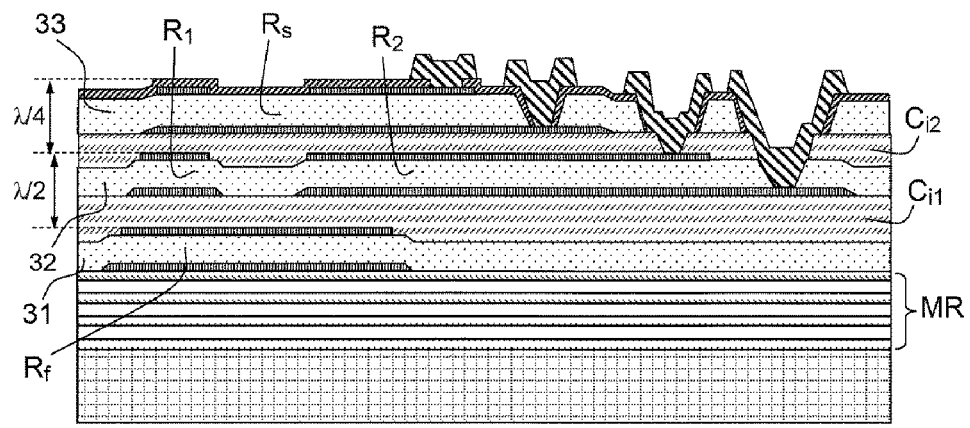
FIGS. 14a and 14b show a cross-sectional view of the technological stack and a top view of a bulk-wave RF combiner according to the invention.
Figure 14B:
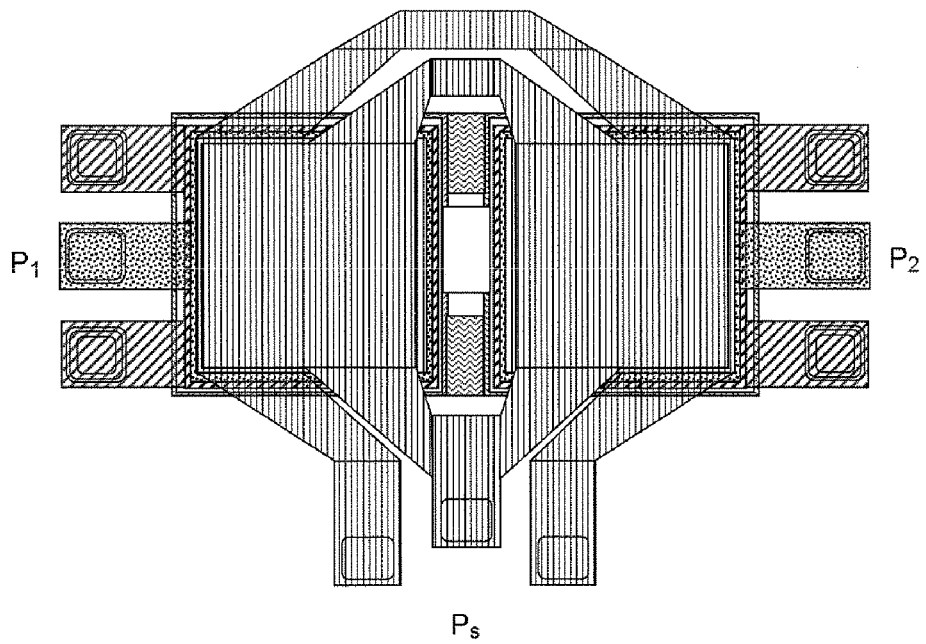

A cross-sectional view of the technological stack and a top view, using the same pattern conventions as previously, are presented in FIGS. 14a and 14b.

An example of a method allowing such a bulk acoustic wave RF combiner to be fabricated will be described hereinbelow.

Figure 15A:
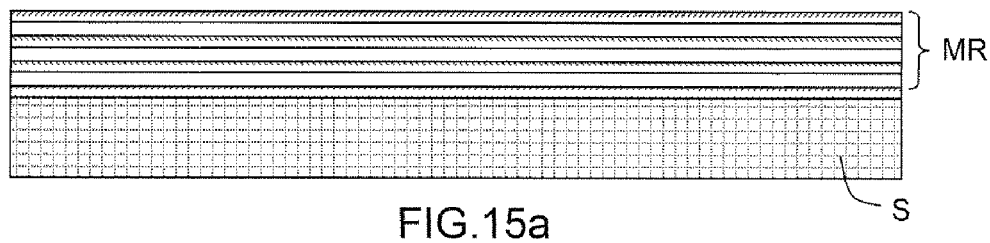
FIGS. 15a to 15t illustrate the various steps in a method for fabricating of the combiner shown in FIGS. 14a and 14b.

According to a first step illustrated in FIG. 15a, layers of SiN and of SiOC composing the Bragg mirror MR are deposited on a high resistivity silicon substrate S by CVD.

Figure 15B:
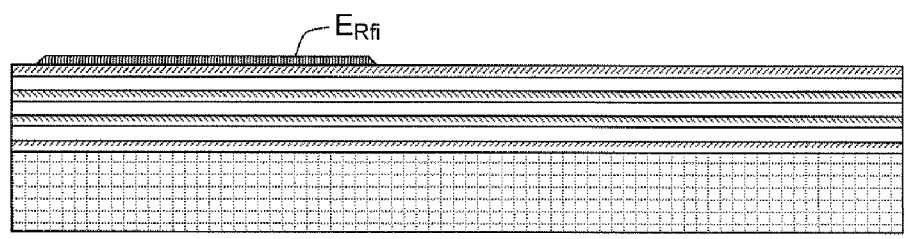

According to a second step illustrated in FIG. 15b, the electrodes $E_{Rfi}$ are deposited by sputtering of molybdenum and are defined by fluorine-based dry etching.

Figure 15C:
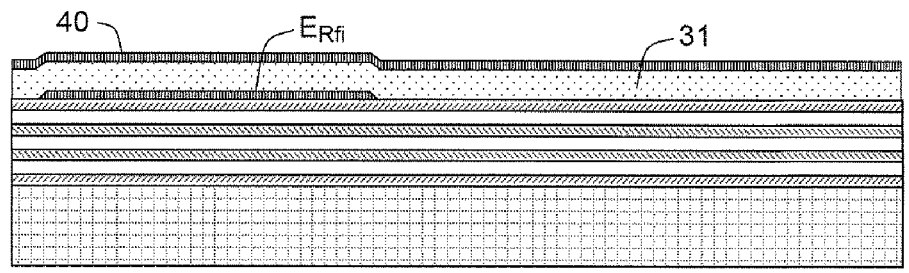

According to a third step illustrated in FIG. 15c, deposition of a first layer 31 of piezoelectric AlN material is carried out by pulsed reactive sputtering, and deposition of a layer 40 by molybdenum sputtering.

Figure 15D:
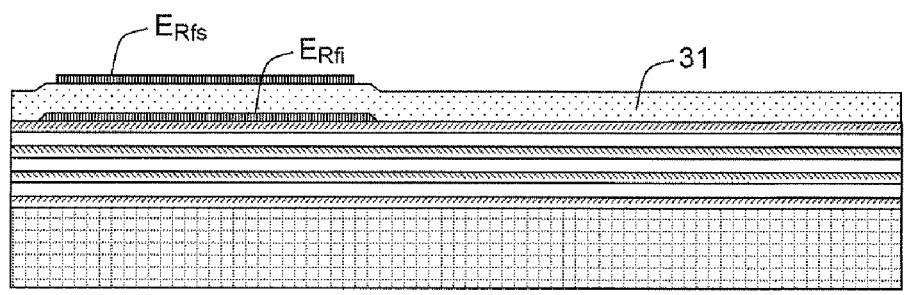

According to a fourth step illustrated in FIG. 15d, the electrodes are defined by fluorine-based dry etching, in such a manner as to define the lower bulk wave resonator, referred to as floating resonator, between two electrodes $E_{Rfi}$ and $E_{Rfs}$.

Figure 15E:
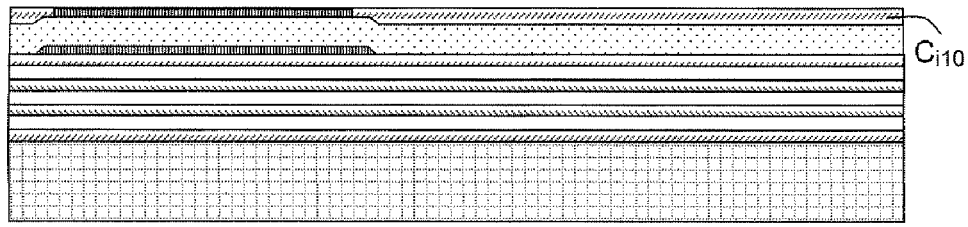

According to a fifth step illustrated in FIG. 15e, a layer $C_{i10}$ of $SiO_2$ is deposited by CVD, followed by a planarization step.

Figure 15F:
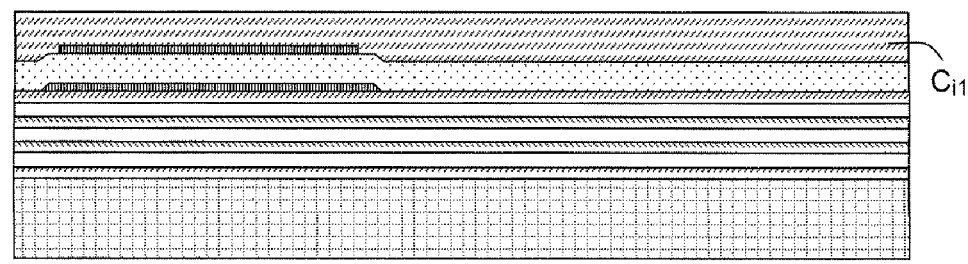

According to a sixth step illustrated in FIG. 15f, the deposition of the propagation medium is carried out, corresponding to the first intermediate thick layer $C_{i1}$ of $SiO_2$ deposited by CVD.

Figure 15G:
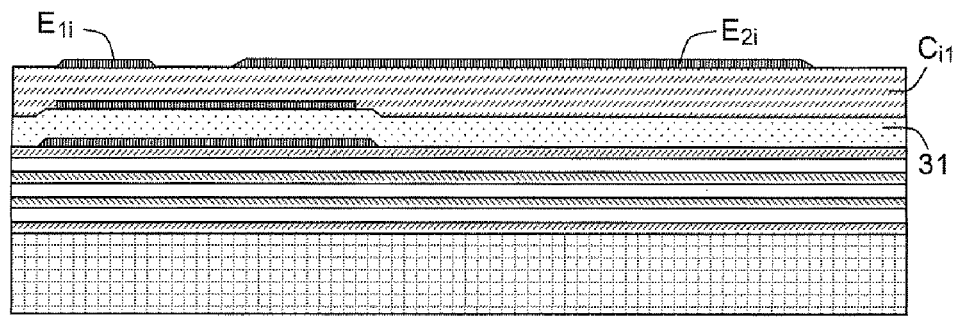
Figure 15H:
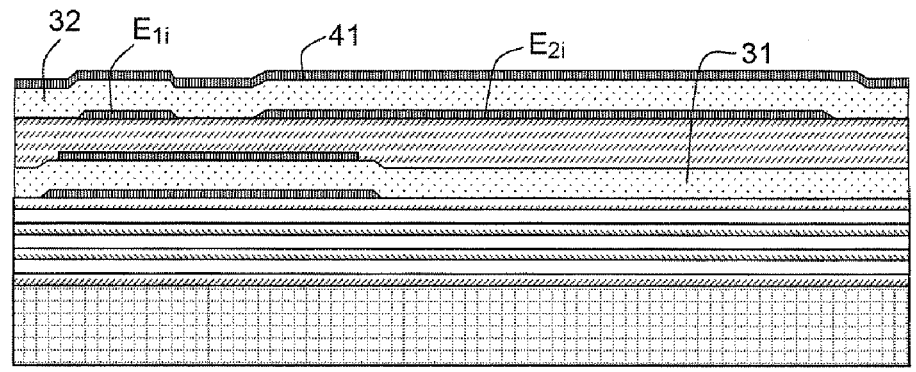

According to a seventh step illustrated in FIG. 15g, the molybdenum electrodes are deposited by sputtering and are defined by fluorine-based dry etching, allowing the lower electrodes $E_{1i}$ and $E_{2i}$ of the two input resonators to be formed;

According to an eighth step illustrated in FIG. 15h, a second layer 32 of AlN material is deposited by pulsed reactive sputtering, and a layer 41 is deposited by molybdenum sputtering.

Figure 15I:
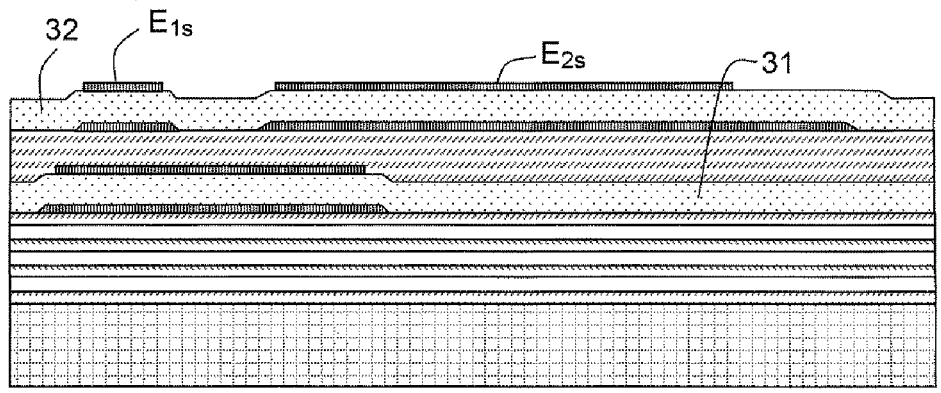

According to a ninth step illustrated in FIG. 15i, the electrodes $E_{1s}$ and $E_{2s}$ are defined by fluorine-based dry etching.

Figure 15J:
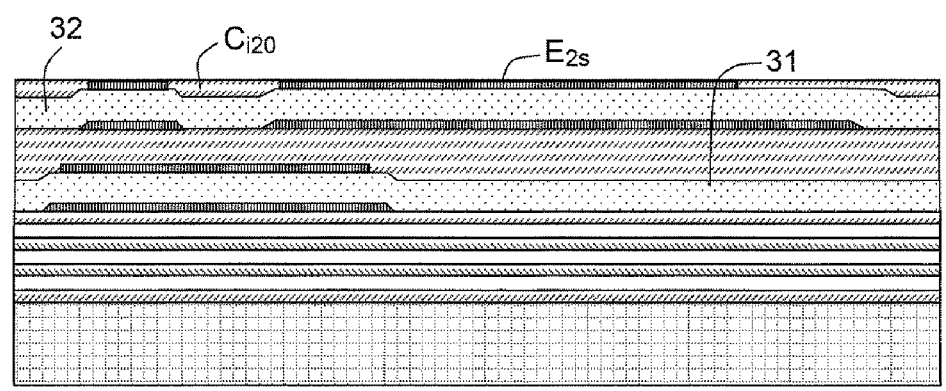

According to a tenth step illustrated in FIG. 15j, a layer $C_{i20}$ of $SiO_2$ is deposited by CVD and then planarized.

Figure 15K:
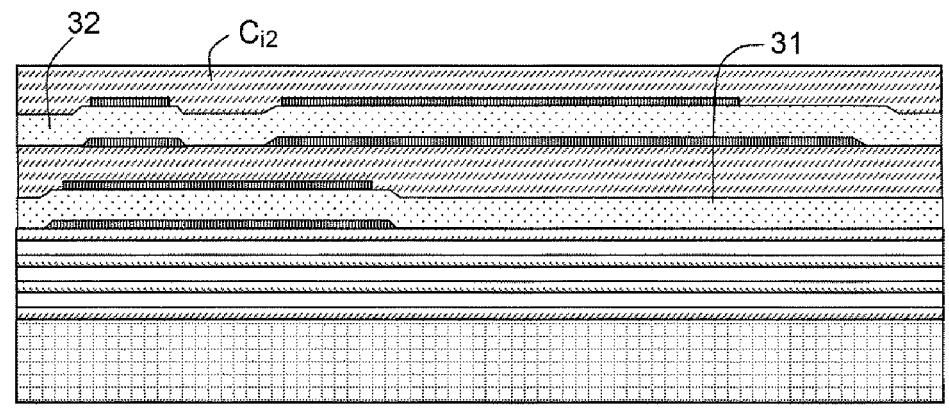

According to a eleventh step illustrated in FIG. 15k, the deposition of the propagation medium is carried out corresponding to the second intermediate layer $C_{i2}$ of $SiO_2$ which is deposited by CVD.

Figure 15L:
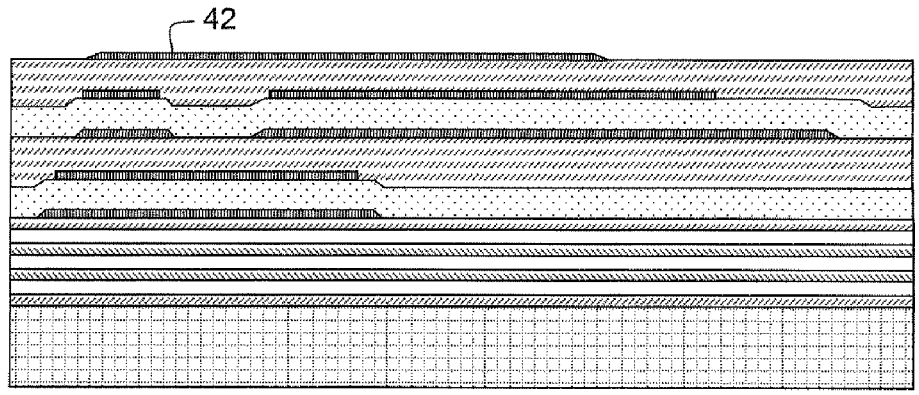

According to an twelfth step illustrated in FIG. 15l, the deposition of a layer of molybdenum 42 is carried out by sputtering and it is defined by fluorine-based dry etching.

Figure 15M:
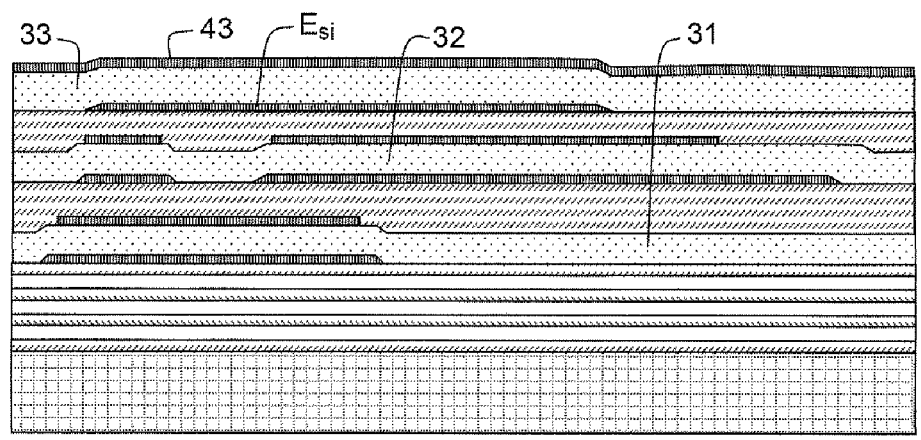

According to a thirteenth step illustrated in FIG. 15m, a third layer 33 of piezoelectric AlN material is deposited by pulsed reactive sputtering, and the electrodes deposited by molybdenum sputtering, thus defining the output resonator on top of a lower electrode $E_{si}$.

Figure 15N:
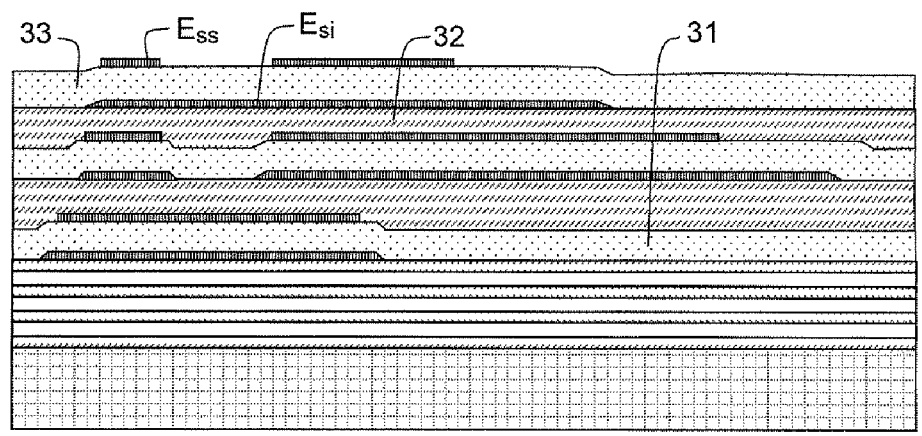

According to a fourteenth step illustrated in FIG. 15n, the electrodes $E_{ss}$ are defined by fluorine-based dry etching.

Figure 15O:
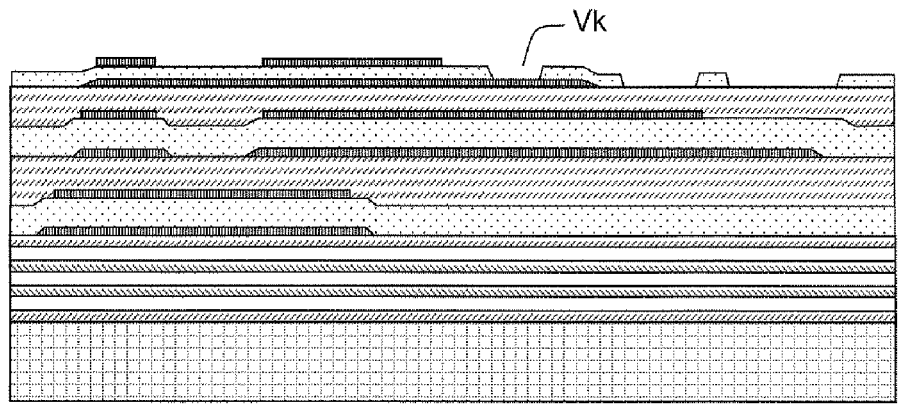

According to a fifteenth step illustrated in FIG. 15o, the vias Vk are opened in the AlN by $H_3PO_4$ wet etching.

Figure 15P:
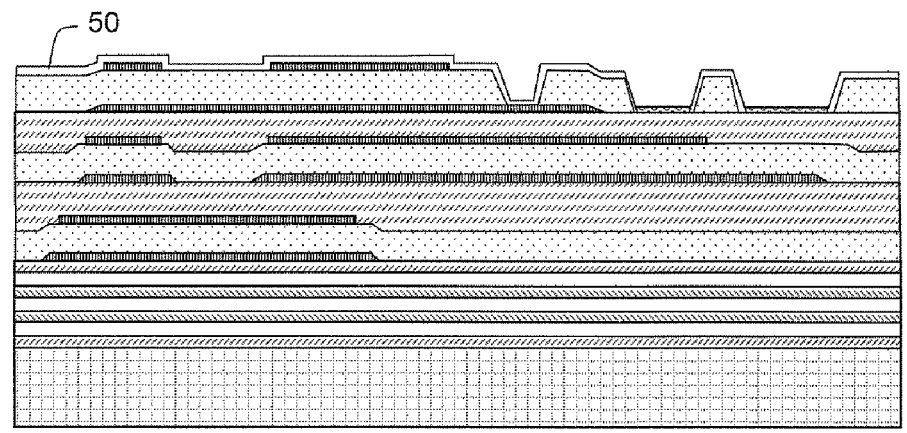

According to a sixteenth step illustrated in FIG. 15p, a passivation layer 50 of SiN is deposited by PVD.

Figure 15Q:
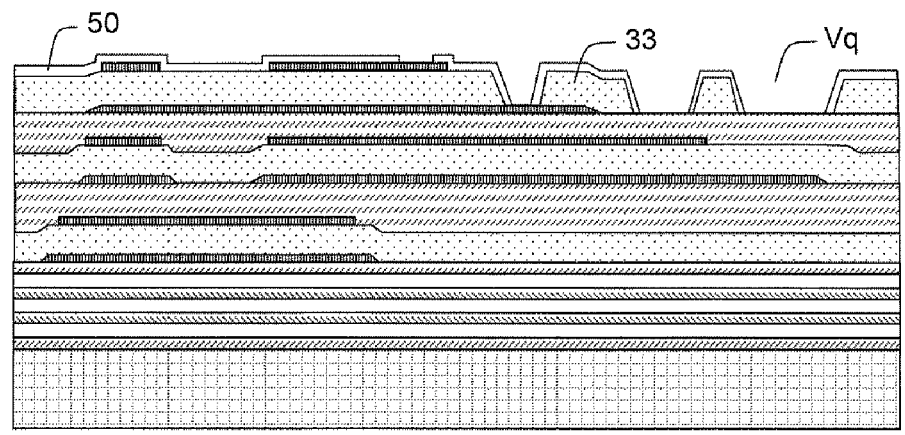

According to a seventeenth step illustrated in FIG. 15q, vias Vq are opened in the passivation layer by fluorine-based dry etching.

Figure 15R:
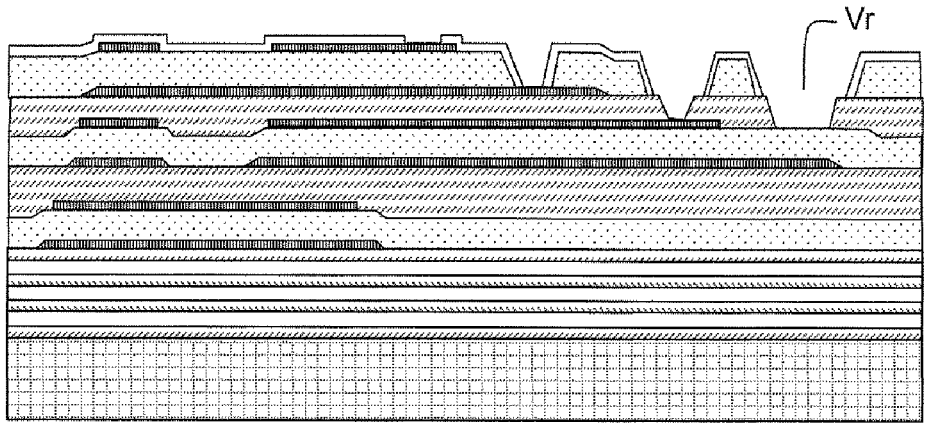

According to a eighteenth step illustrated in FIG. 15r, vias Vr are opened in the propagation layer by fluorine-based dry etching.

Figure 15S:
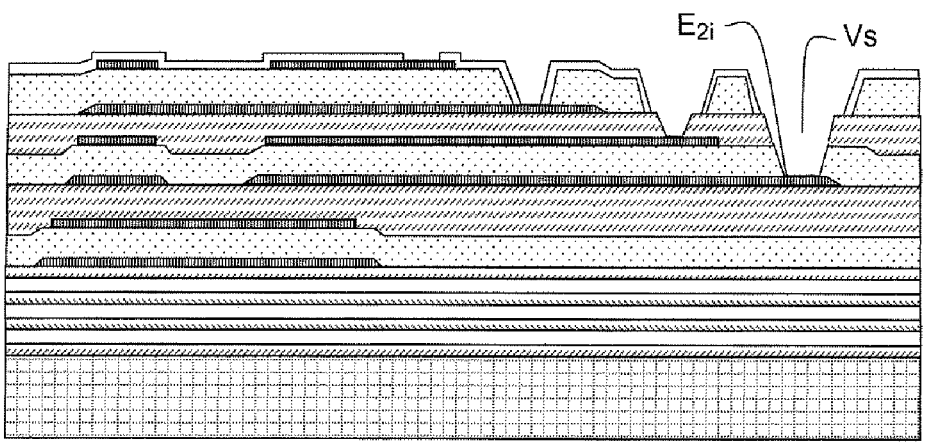

According to an nineteenth step illustrated in FIG. 15s, the wet $H_3PO_4$ etching of the AlN is carried out leading to openings Vs allowing access to the electrode $E_{2i}$.

Figure 15T:
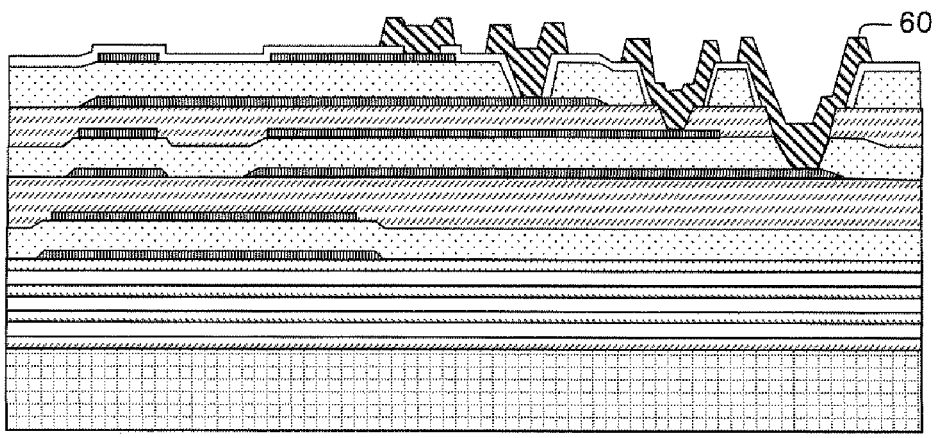

According to a twentieth step illustrated in FIG. 15t, contacts composed of AlCu are formed by sputtering of a layer 60 and definition by $H_3PO_4$ wet etching.

The invention claimed is:

1. A combiner for electrical signals, comprising:
a first transducer connected to a first input port and a second transducer connected to a second input port, and a third transducer connected to an output port, said first, second, and third transducers forming one of a series of subsets of transducers, the electrical signals being propagated between the first and the second input and the output ports, wherein the combiner comprises a medium; and
each of the first, second and third transducers are acoustic wave transducers, the electrical signals being carried by acoustic waves propagated between the first and second input ports and the output port within the medium, wherein as a part of the series of transducers of the subsets:
at least one of the first transducers of the series is placed between two second transducers connected to respective second input ports in such a manner that acoustic waves emitted by the two second transducers of the second input ports are 180° out of phase at the first input port to generate destructive interferences; and
at least one of the second transducers of the series is placed between two first transducers at the first input port in such a manner that acoustic waves emitted by the two first transducers at the first input port are 180° out of phase at the second input port, so as to generate destructive interferences.

2. The combiner according to claim 1, wherein:
in the series of transducers:
each of the first transducer and the third transducer are separated by an acoustic distance of $(2k+1)\lambda/4$ with k being an integer greater than or equal to 0, with $\lambda$ being an acoustic propagation wavelength;
each of the second transducer and the third transducer are separated by an acoustic distance of $(2k'+1)\lambda/4$ with k' being an integer greater than or equal to 0; and
in a given subset of the series of transducers, the first and the at least one second transducers are separated by an acoustic distance of $(2k''+2)\lambda/4$ with k'' being an integer greater than or equal to 0,
in such a manner as to generate constructive interference at the output port.

3. The combiner according to claim 1, wherein the medium comprises at least one layer of a material capable of allowing propagation of the acoustic waves.

4. The combiner according to claim 3, wherein each of the transducers are Lamb-wave transducers.

5. The combiner according to claim 4, wherein the medium comprises a suspended membrane structure configured to confine Lamb waves in the Lamb-wave transducers, said suspended membrane structure comprising a stack of at least one layer of piezoelectric material and of at least one series of electrodes.

6. The combiner according to claim 4, further comprising a Bragg mirror structure, a stack of at least one layer of piezoelectric material and of at least one series of electrodes.

7. The combiner according to claim 4, comprising between each $i^{th}$ subset in the series of subsets respectively comprising the first input transducer, the third output transducer and the second input transducer, a first secondary transducer that is connected to the first input port and positioned at an acoustic distance equal to $\lambda$ from the second input transducer belonging to the $i^{th}$ subset, and a second secondary transducer that is connected to the second input port and positioned at an acoustic distance equal to $\lambda/2$ from the said first secondary transducer and at an acoustic distance equal to $\lambda$ from a first input transducer of the $(i+1)^{th}$ subset.

8. The combiner according to claim 4, wherein each of the transducers comprise a piezoelectric material with a high piezoelectric coupling coefficient greater than at least 0.5%.

9. The combiner according to claim 3, wherein the material is a piezoelectric material.

10. The combiner according to claim 1, further comprising:
one first and one second reflector respectively positioned at a beginning and at an end of the series of subsets of transducers in order to allow a path of the acoustic waves to be folded back.

11. The combiner according claim 1, the combiner being a radio frequency (RF) combiner.

12. The combiner according to claim 1, wherein
at least one third transducer in the series of transducers at the output port is placed between the first and second transducers of respectively the first and second input ports at a position where the phase differences of the waves emitted by each of the first and second transducers are equal at the output port so as to generate constructive interference.

13. A combiner for electrical signals comprising:

a subset of transducers comprising at least one first transducer connected to a first input port and at least one second transducer connected to a second input port, and at least one third transducer connected to an output port, the electrical signals being propagated between the input and output ports, wherein the combiner comprises a medium; and each of the at least one first, at least one second and at least one third transducers being bulk acoustic wave transducers, the electrical signals being carried by acoustic waves propagated between the first and second input ports and the output port within the medium, said medium being made of three stacked levels comprising:

a first level comprising at least one lower transducer being a fourth transducer;

a second level comprising the at least first and second transducers the first and second levels being separated by a first intermediate layer; and a third level comprising the at least one third transducer, the third level being separated from the second level by a second intermediate layer wherein the thickness of the second level and the first intermediate layer being chosen such that the first and second transducers are at 180° out of phase with the fourth transducer, and the third level with the second intermediate layer being chosen so as the first and second transducers are at 90° out of phase with the third transducer.

14. The combiner according to claim 13, wherein each of the transducers comprise a piezoelectric layer of AlN, the first and the second intermediate layers being composed of $SiO_2$.

15. The combiner according to claim 13, wherein a thicknesses of the second level and of the first intermediate layer make a total of $(2k'+2)\lambda/4$ with k' being an integer greater than or equal to 0, and wherein a thicknesses of the third level and of the second intermediate layer make a total of $(2k+1)\lambda/4$ with k being an integer greater than or equal to 0.

16. The combiner according to claim 13, wherein each of the first, second and third levels comprises at least one layer of material configured to allow the propagation of acoustic waves, said layer of material comprising a layer of piezoelectric material and at least one series of electrodes.

17. The combiner according to claim 13 further comprising a Bragg mirror structure under the first, second, and third levels.

18. The combiner according to claim 13, the combiner being a radio frequency (RF) combiner.

19. The combiner according to claim 13, wherein each of the transducers comprises a piezoelectric material with a high piezoelectric coupling coefficient greater than at least 0.5%.

* * * * *